US012267060B2

(12) United States Patent
Inoue et al.

(10) Patent No.: US 12,267,060 B2
(45) Date of Patent: Apr. 1, 2025

(54) RESONANCE DEVICE

(71) Applicant: Murata Manufacturing Co., Ltd., Nagaokakyo (JP)

(72) Inventors: Yoshihisa Inoue, Nagaokakyo (JP); Ville Kaajakari, Helsinki (FI); Ryota Kawai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 827 days.

(21) Appl. No.: 17/493,037

(22) Filed: Oct. 4, 2021

(65) Prior Publication Data

US 2022/0029598 A1 Jan. 27, 2022

Related U.S. Application Data

(63) Continuation of application No. PCT/JP2020/003845, filed on Feb. 3, 2020.
(Continued)

(51) Int. Cl.
*H03H 9/02* (2006.01)
*H03H 9/05* (2006.01)
(Continued)

(52) U.S. Cl.
CPC ...... *H03H 9/02448* (2013.01); *H03H 9/0595* (2013.01); *H03H 9/1057* (2013.01); *H03H 9/2489* (2013.01); *H03H 2009/0248* (2013.01)

(58) Field of Classification Search
CPC .......... H03H 9/02448; H03H 9/0595; H03H 9/1057; H03H 9/2489
(Continued)

(56) References Cited

U.S. PATENT DOCUMENTS 8,405,284 B2 3/2013 Ichikawa
10,749,496 B2 8/2020 Yoshii et al.
(Continued)

FOREIGN PATENT DOCUMENTS

JP 2010147666 A 7/2010
JP 2016213807 A 12/2016
(Continued)

OTHER PUBLICATIONS

International Search Report issued in PCT/JP2020/003845, date of maiing Mar. 24, 2020.
(Continued)

*Primary Examiner* — Derek J Rosenau
(74) *Attorney, Agent, or Firm* — ArentFox Schiff LLP

(57) ABSTRACT

A resonance device is provided that includes a resonator having a base, a vibrating arm extending from one end of the base along a first direction, a frame disposed around at least a part of the vibrating arm and holding the vibrating arm such that the vibrating arm is configured to vibrate, and a support arm connecting the base to the frame. Moreover, a first substrate is provided that includes a first recess forming at least a part of a vibration space for the resonator and a first limiting portion provided away from the support arm by a first distance in a thickness direction, in which the first distance is smaller than a distance between a bottom surface of the first recess and the vibrating arm in the thickness direction of the first substrate.

19 Claims, 14 Drawing Sheets

Related U.S. Application Data

(60) Provisional application No. 62/866,824, filed on Jun. 26, 2019.

(51) Int. Cl.
*H03H 9/10* (2006.01)
*H03H 9/24* (2006.01)

(58) Field of Classification Search
USPC .......................................................... 310/348
See application file for complete search history.

(56) References Cited

U.S. PATENT DOCUMENTS

| | | | | |
|---|---|---|---|---|
| 2006/0091765 A1* | 5/2006 | Oouchi | .................... | H03B 5/32 |
| | | | | 310/348 |
| 2010/0148634 A1 | 6/2010 | Ichikawa | | |
| 2010/0156246 A1* | 6/2010 | Iwai | ..................... | H03H 9/0595 |
| | | | | 310/370 |
| 2016/0190426 A1* | 6/2016 | Kobayashi | ............... | H03H 9/21 |
| | | | | 310/348 |
| 2016/0322935 A1 | 11/2016 | Yamada et al. | | |
| 2019/0097600 A1 | 3/2019 | Yoshii et al. | | |
| 2019/0109578 A1 | 4/2019 | Goto et al. | | |

FOREIGN PATENT DOCUMENTS

| | | |
|---|---|---|
| WO | 2017208568 A1 | 12/2017 |
| WO | 2018008480 A1 | 1/2018 |

OTHER PUBLICATIONS

Written Opinion of the International Searching Authority issued in PCT/JP2020/003845, date of maiing Mar. 24, 2020.

* cited by examiner

RESONANCE DEVICE

CROSS REFERENCE TO RELATED APPLICATIONS

The present application is a continuation of PCT/JP2020/003845 filed Feb. 3, 2020, which claims priority to U.S. Provisional Patent Application No. 62/866,824, filed Jun. 26, 2019, the entire contents of each of which are incorporated herein by reference.

TECHNICAL FIELD

The present invention relates to a resonance device that vibrates in a contour vibration mode.

BACKGROUND

Hitherto, a resonance device using micro electro mechanical systems (MEMS) technology has been used as, for example, a timing device. The resonance device is mounted on a printed circuit board embedded in an electronic device such as a smartphone. Generally, the resonance device includes a lower substrate, an upper substrate forming a cavity with the lower substrate, and a resonator disposed in the cavity between the lower substrate and the upper substrate.

For example, International Publication No. 2017/208568 (hereinafter "Patent Document (PTL) 1") discloses a resonance device including a resonator. The resonator includes a first electrode and a second electrode, a piezoelectric film provided between the first electrode and the second electrode, having an upper surface facing the first electrode, and vibrating in a predetermined vibration mode when a voltage is applied between the first electrode and the second electrode, a protective film made of an insulating material and provided so as to face the upper surface of the piezoelectric film with the first electrode interposed therebetween, and a frequency adjustment film made of a conductive material and provided so as to face the upper surface of the piezoelectric film with the protective film interposed therebetween, in which the frequency adjustment film is electrically connected to either one of the first electrode and the second electrode.

In the resonance device of PTL 1, a vibrating portion and a frame of the resonator are connected by a support arm. In such a resonance device, ultrasonic vibration may be applied to the resonator during ultrasonic welding, ultrasonic cleaning, or the like.

When ultrasonic vibration is applied, the support arm of the resonator may violently vibrate up and down due to a spurious mode existing in the frequency region of the ultrasonic vibration. As a result, a large amount of stress is applied to the connecting portion between the support arm and the frame, which may damage or break the connecting portion or the periphery thereof.

SUMMARY OF THE INVENTION

Accordingly, the exemplary embodiments of the present invention have been made in view of such circumstances. In particular, a resonance device is provided that is constructed to reduce stress applied to a connecting portion between a support arm and a frame.

Thus, a resonance device according to one exemplary aspect includes a resonator including a base, a vibrating arm extending from one end of the base along a first direction, a frame disposed around at least a part of the vibrating arm and holding the vibrating arm such that the vibrating arm is configured to vibrate, and a support arm connecting the base to the frame. Moreover, a first substrate is provided including a first recess forming at least a part of a vibration space for the resonator, and a first limiting portion provided away from the support arm by a first distance in a thickness direction, in which the first distance is smaller than a distance between a bottom surface of the first recess and the vibrating arm in the thickness direction of the first substrate.

Moreover, a resonance device according to another exemplary aspect is provided that includes a resonator including a base, a vibrating arm extending from one end of the base along a first direction, a frame disposed around at least a part of the vibrating arm and holding the vibrating arm such that the vibrating arm is configured to vibrate, and a support arm connecting the base to the frame, a first substrate including a first recess forming at least a part of a vibration space for the resonator, a second substrate disposed in a state of facing the first substrate with the resonator interposed between the second substrate and the first substrate, and including a second recess forming at least a part of the vibration space for the resonator, a bonding portion configured to bond the resonator and the second substrate, and provide a predetermined distance between a surface of the second substrate facing the resonator and the support arm in a thickness direction of the second substrate, in which the predetermined distance is smaller than a distance between the vibrating arm and a bottom surface of the second recess in the thickness direction of the second substrate.

According to the exemplary aspects of the present invention, the stress applied to the connecting portion between the support arm and the frame is reduced.

DETAILED DESCRIPTION OF EMBODIMENTS

Figure 1:
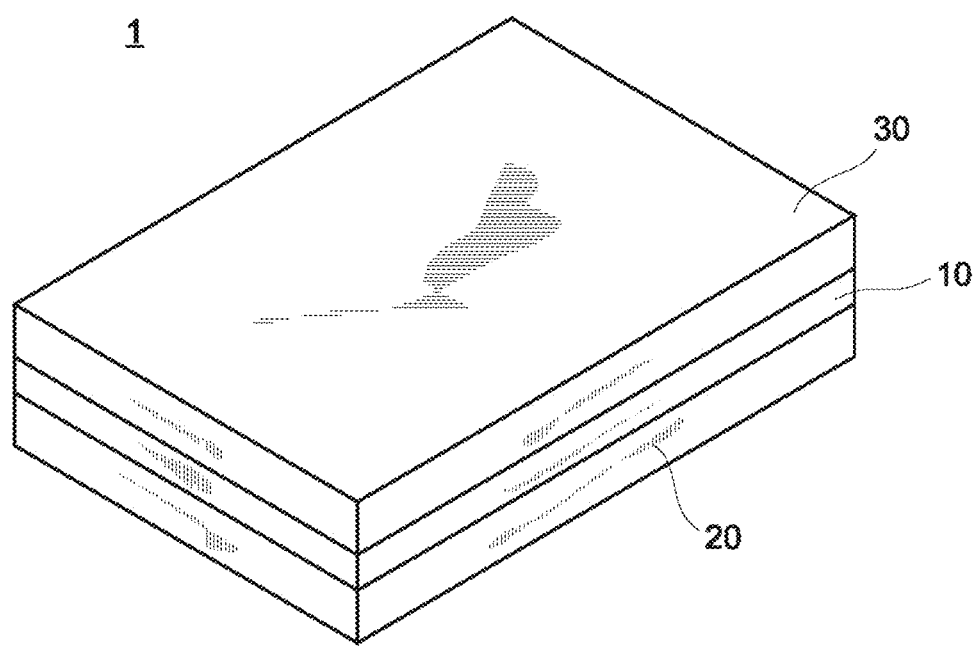
FIG. 1 is a perspective view schematically illustrating the appearance of a resonance device according to a first exemplary embodiment.
Figure 1:
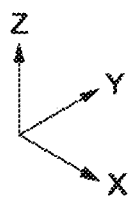

Exemplary embodiments of the present invention will be described below. In the description of the drawings below, the same or similar components are denoted by the same or similar reference numerals. The drawings are illustrative, and dimensions and shapes of each part are schematic, and the technical scope of the present invention should not be construed as being limited to the exemplary embodiments.

First Exemplary Embodiment

Figure 2:
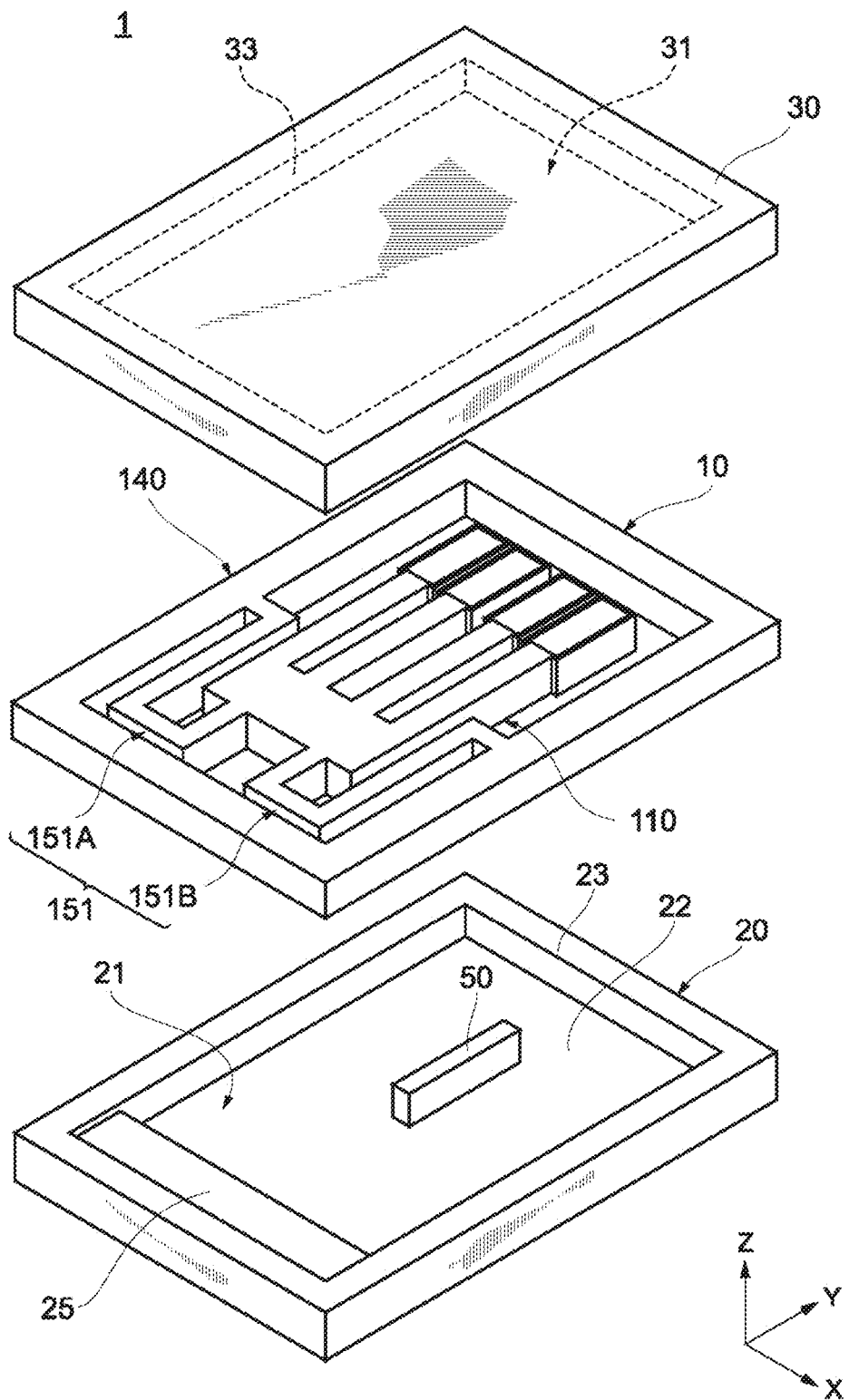
FIG. 2 is an exploded perspective view schematically illustrating the structure of the resonance device illustrated in FIG. 1.

First, a schematic configuration of a resonance device according to a first exemplary embodiment will be described with reference to FIGS. 1 and 2. FIG. 1 is a perspective view schematically illustrating the appearance of a resonance device 1 according to the first embodiment. FIG. 2 is an exploded perspective view schematically illustrating the structure of the resonance device 1 illustrated in FIG. 1.

The resonance device 1 includes a lower lid 20, a resonator 10, and an upper lid 30. That is, the resonance device 1 is configured by laminating the lower lid 20, the resonator 10, and the upper lid 30 in this order. The lower lid 20 and the upper lid 30 are disposed so as to face each other with the resonator 10 interposed therebetween. For purposes of this disclosure, the lower lid 20 corresponds to an example of a "first substrate", and the upper lid 30 corresponds to an example of a "second substrate".

Hereinafter, configurations of the resonance device 1 will be described. In the following description, in the resonance device 1, a side provided with the upper lid 30 is referred to as an upper side (or a front side), and a side provided with the lower lid 20 is referred to as a lower side (or a back side).

The resonator 10 is a MEMS vibrator manufactured using the MEMS technology. The resonator 10, the lower lid 20, and the upper lid 30 are bonded to each other so that the resonator 10 is sealed and a vibration space for the resonator 10 is formed. The resonator 10, the lower lid 20, and the upper lid 30 are each formed using a silicon (Si) substrate (hereinafter referred to as "Si substrate"), and the Si substrates are bonded to each other. The resonator 10, the lower lid 20, and the upper lid 30 may each be formed using a silicon on insulator (SOI) substrate formed by laminating a silicon layer and a silicon oxide film according to an exemplary aspect.

The lower lid 20 includes a rectangular flat plate-shaped bottom plate 22 provided along the XY plane, and a side wall 23 extending from a peripheral edge portion of the bottom plate 22 in the Z-axis direction, that is, in the laminated direction of the lower lid 20 and the resonator 10. A recess 21 defined by a surface of the bottom plate 22 and an inner surface of the side wall 23 is formed on the surface of the lower lid 20 facing the resonator 10. The recess 21 forms at least a part of a vibration space for the resonator 10.

The lower lid 20 includes a limiting portion 25 (or "limiter") provided on the surface of the bottom plate 22 and a protruding portion 50 formed on the surface of the bottom plate 22. Detailed configurations of the limiting portion 25 and the protruding portion 50 will be described later.

The upper lid 30 includes a rectangular flat plate-shaped bottom plate 32 provided along the XY plane, and a side wall 33 extending from a peripheral edge portion of the bottom plate 32 in the Z-axis direction. A recess 31 defined by a surface of the bottom plate 32 and an inner surface of the side wall 33 is formed on the surface of the upper lid 30 facing the resonator 10. The recess 31 forms at least a part of a vibration space, which is a space where the resonator 10 vibrates.

By bonding the upper lid 30, the resonator 10, and the lower lid 20, the vibration space for the resonator 10 is hermetically sealed, and a vacuum state is maintained. In one exemplary aspect, the vibration space can be filled with a gas such as an inert gas.

Figure 3:
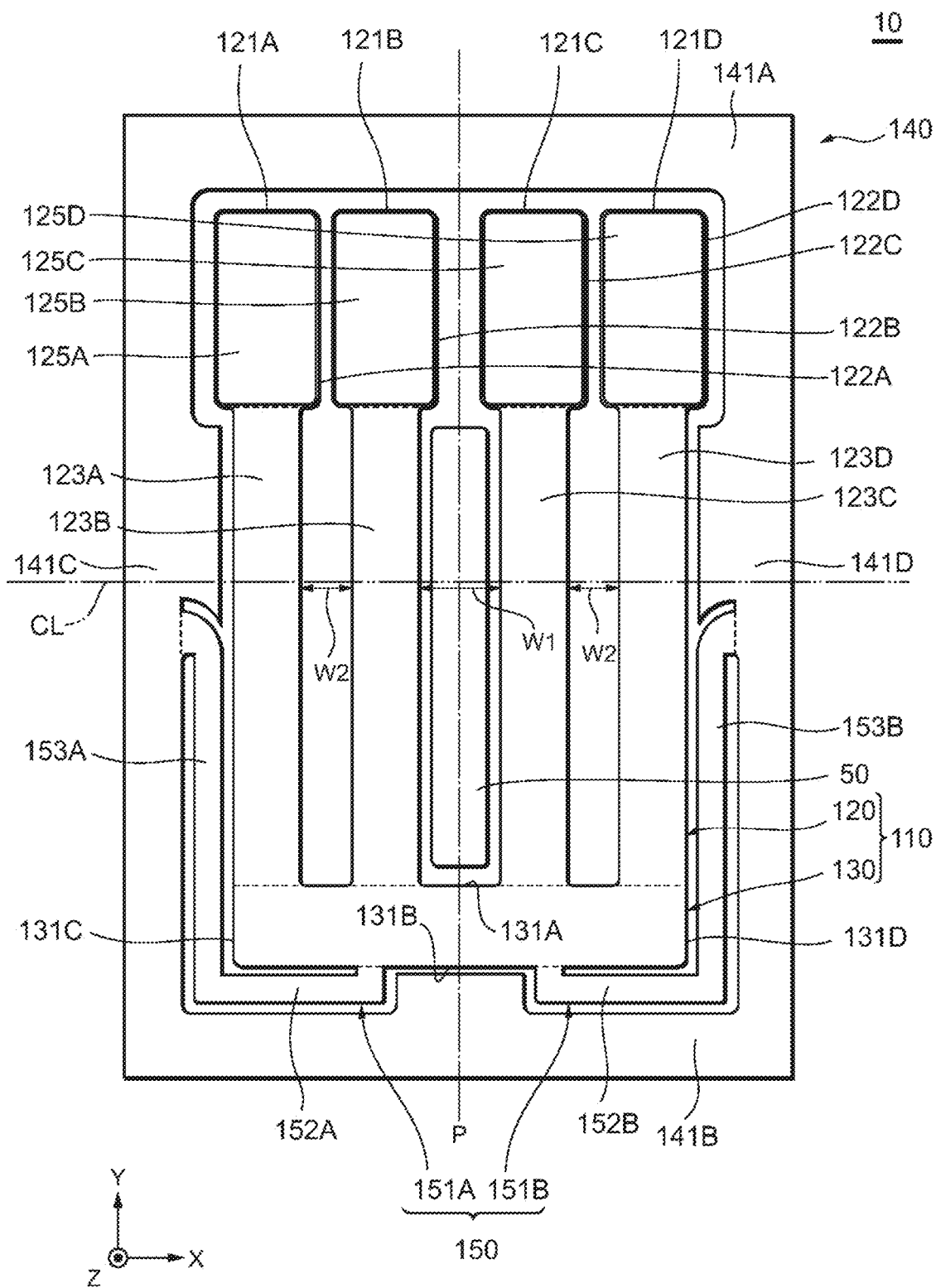
FIG. 3 is a plan view schematically illustrating the structure of a resonator illustrated in FIG. 2.

Next, a schematic configuration of the resonator according to the first embodiment will be described with reference to FIG. 3. FIG. 3 is a plan view schematically illustrating the structure of the resonator 10 illustrated in FIG. 2.

As illustrated in FIG. 3, the resonator 10 is a MEMS vibrator manufactured using the MEMS technology, and vibrates in an out-of-plane bending vibration mode as a main vibration (hereinafter, also referred to as a "main mode" or a "primary mode") in an XY plane in the orthogonal coordinate system of FIG. 3. It is noted that the resonator 10 is not limited to the resonator using the out-of-plane bending vibration mode. The resonator of the resonance device 1 may use, for example, a spreading vibration mode, a thickness longitudinal vibration mode, a Lamb wave vibration mode, an in-plane bending vibration mode, or a surface acoustic wave vibration mode. These vibrators are applied to, for example, a timing device, an RF filter, a duplexer, an ultrasonic transducer, a gyro sensor, an acceleration sensor, and the like. In addition, these vibrators may be used for a piezoelectric mirror, a piezoelectric gyro, and an optical scanner MEMS mirror that have an actuator function, and a piezoelectric microphone and an ultrasonic vibration sensor that have a pressure sensor function, and the like. Further, these vibrators may be applied to an electrostatic MEMS element, an electromagnetically driven MEMS element, and a piezoresistive MEMS element. Furthermore, these vibrators can be applied to a MHz vibrator used in a MHz oscillator.

The resonator 10 includes a vibrating portion 110, a holding portion 140 (or referred to as a frame), and a support arm 150.

The vibrating portion 110 has a rectangular contour extending along the XY plane in the orthogonal coordinate system of FIG. 3. The vibrating portion 110 is disposed inside the holding portion 140, and a space is formed between the vibrating portion 110 and the holding portion 140 at a predetermined distance. In the example of FIG. 3, the vibrating portion 110 includes an excitation portion 120 formed of four vibrating arms 121A to 121D (hereinafter, also collectively referred to as "vibrating arms 121") and a base portion 130 (or simply a base). The number of vibrating arms is not limited to four, and can be set to any number of, for example, two or more. In the present embodiment, the excitation portion 120 and the base portion 130 are integrally formed.

The vibrating arms 121A, 121B, 121C, and 121D each extend along the Y-axis direction, and are provided in parallel in the X-axis direction at predetermined distances in this order. One end of the vibrating arm 121A is a fixed end connected to a front end portion 131A of the base portion 130, which will be described later, and the other end of the vibrating arm 121A is an open end provided apart from the front end portion 131A of the base portion 130. The vibrating arm 121A includes a mass addition portion 122A formed on the open end side and an arm portion 123A extending from the fixed end and connected to the mass addition portion 122A. Similarly, the vibrating arms 121B, 121C, and 121D also include mass addition portions 122B, 122C, and 122D, and arm portions 123B, 123C, and 123D, respectively. According to an exemplary aspect, the arm portions 123A to 123D each have, for example, a width of approximately 50 μm in the X-axis direction and a length of approximately 465 μm in the Y-axis direction.

In the excitation portion 120 of the present embodiment, the two vibrating arms 121A and 121D are disposed on the outer side portion and the two vibrating arms 121B and 121C are disposed on the inner side portion in the X-axis direction. A width of a gap (hereinafter, referred to as "release width") W1 formed between the respective arm portions 123B and 123C of the two inner vibrating arms 121B and 121C is set to be, for example, larger than a release width W2 between the respective arm portions 123A and 123B of the vibrating arms 121A and 121B adjacent to each other in the X-axis direction, and a release width W2 between the respective arm portions 123D and 123C of the vibrating arms 121D and 121C adjacent to each other in the X-axis direction. In an exemplary aspect, the release width W1 is, for example, approximately 25 μm, and the release width W2 is, for example, approximately 10 μm. By setting the release width W1 larger than the release width W2 in this way, the vibration characteristics and durability of the vibrating portion 110 are improved. The release width W1 may be set smaller than the release width W2 or may be set equal to the release width W2 so that the resonance device 1 can be reduced in size.

Moreover, mass addition films 125A to 125D are provided on the surfaces of mass addition portions 122A to 122D, respectively. Therefore, the weight per unit length (hereinafter also simply referred to as "weight") of each of the mass addition portions 122A to 122D is heavier than the weight of each of the arm portions 123A to 123D. This configuration improves the vibration characteristics while reducing the size of the vibrating portion 110. Each of the mass addition films 125A to 125D has not only a function of increasing the weight of a tip portion of each of the vibrating arm 121A to 121D but also a function as a so-called frequency adjustment film that adjusts the resonant frequency of each of the vibrating arms 121A to 121D by cutting off a part thereof.

In the present embodiment, the width of each of the mass addition portions 122A to 122D along the X-axis direction is, for example, approximately 70 μm, which is larger than the width of each of the arm portions 123A to 123D along the X-axis direction. This configuration further increases the weight of each of the mass addition portions 122A to 122D. However, as long as the weight of each of the mass addition portions 122A to 122D is larger than the weight of each of the arm portions 123A to 123D, the width of each of the mass addition portions 122A to 122D along the X-axis direction is not limited to the example of the present embodiment. The width of each of the mass addition portions 122A to 122D along the X-axis direction may be equal to or smaller than the width of each of the arm portions 123A to 123D along the X-axis direction.

When the resonator 10 is viewed from above in a plan view (hereinafter, simply referred to as "in a plan view"), each of the mass addition portions 122A to 122D has a substantially rectangular shape and has rounded curved shapes, for example, so-called round chamfers, at four corners. Similarly, each of the arm portions 123A to 123D has a substantially rectangular shape, and has round corners in the vicinity of a fixed end connected to the base portion 130 and in the vicinity of a connecting portion connected to each of the mass addition portions 122A to 122D. However, the shapes of each of the mass addition portions 122A to 122D and the arm portions 123A to 123D are not limited to the example of the present embodiment. For example, each of the mass addition portions 122A to 122D may have a substantially trapezoidal shape or a substantially L-shape. Each of the arm portions 123A to 123D may have a substantially trapezoidal shape. Each of the mass addition portions 122A to 122D and the arm portions 123A to 123D may be formed with a bottomed groove having an opening on one of the front side and the back side, or a hole having openings on both the front side and the back side. The groove and the hole may be separated from a side surface connecting the front surface and the back surface, or may have the opening close to the side surface according to various exemplary aspects.

The base portion 130 (or simply base) has a front end portion 131A, a rear end portion 131B, a left end portion 131C, and a right end portion 131D in a plan view. The front end portion 131A, the rear end portion 131B, the left end portion 131C, and the right end portion 131D are each a part of the outer edge portion of the base portion 130. Specifically, the front end portion 131A and the rear end portion 131B are end portions each extending in the X-axis direction, and the front end portion 131A and the rear end portion 131B are disposed so as to face each other. The left end portion 131C and the right end portion 131D are end portions each extending in the Y-axis direction, and the left end portion 131C and the right end portion 131D are disposed so as to face each other. Both ends of the left end portion 131C are connected to one end of the front end portion 131A and one end of the rear end portion 131B, respectively. Both ends of the right end portion 131D are connected to the other end of the front end portion 131A and the other end of the rear end portion 131B, respectively. The vibrating arms 121A to 121D are connected to the front end portion 131A, and a left support arm 151A and a right support arm 151B, which will be described later, are connected to the rear end portion 131B.

In a plan view, the base portion 130 has a substantially rectangular shape with the front end portion 131A and the rear end portion 131B as long sides and the left end portion 131C and the right end portion 131D as short sides. The base portion 130 is formed substantially symmetrically with respect to a virtual plane P defined along respective perpendicular bisectors of the front end portion 131A and the rear end portion 131B. The shape of the base portion 130 is not limited to the rectangular shape illustrated in FIG. 3, and may be another shape that is substantially plane symmetric with respect to the virtual plane P. For example, in alternative aspects, the shape of the base portion 130 may be a trapezoidal shape in which one of the front end portion 131A and the rear end portion 131B is longer than the other. At least one of the front end portion 131A, the rear end portion 131B, the left end portion 131C, and the right end portion 131D may be bent or curved.

The virtual plane P corresponds to a plane of symmetry of the entire vibrating portion 110. Therefore, the virtual plane P is also a plane passing through the center of the vibrating arms 121A to 121D in the X-axis direction, and is located between the vibrating arms 121B and 121C. Specifically, the adjacent vibrating arms 121A and 121B is formed symmetrically with the adjacent vibrating arms 121D and 121C, respectively, with the virtual plane P interposed therebetween.

In the base portion 130, a base portion length, which is the longest distance between the front end portion 131A and the rear end portion 131B in the Y-axis direction, is, for example, approximately 40 µm. A base portion width, which is the longest distance between the left end portion 131C and the right end portion 131D in the X-axis direction, is, for example, approximately 300 µm. In the example illustrated in FIG. 3, the base portion length corresponds to a length of the left end portion 131C or the right end portion 131D, and the base portion width corresponds to a length of the front end portion 131A or the rear end portion 131B.

The holding portion 140 (or simply the frame) is configured to hold the vibrating arms 121A to 121D such that the vibrating arms 121A to 121D can vibrate. Specifically, the holding portion 140 is formed plane-symmetrically with respect to the virtual plane P. The holding portion 140 has a rectangular frame shape in a plan view, and is disposed so as to surround the outer side portion of the vibrating portion 110 along the XY plane. As described above, since the holding portion 140 has the frame shape in a plan view, the holding portion 140 surrounding the vibrating portion 110 can be easily obtained.

It is noted that the holding portion 140 is not limited to the frame shape as long as the holding portion 140 is disposed at least partially around the vibrating portion 110. For example, in alternative aspects, the holding portion 140 may be disposed around the vibrating portion 110 so as to hold the vibrating portion 110 and to be bonded to the upper lid 30 and the lower lid 20.

In the present embodiment, the holding portion 140 includes frame bodies 141A to 141D which are integrally formed. As illustrated in FIG. 3, the longitudinal direction of the frame body 141A is provided parallel to the X-axis so that the frame body 141A faces the open ends of the vibrating arms 121A to 121D. The longitudinal direction of the frame body 141B is provided parallel to the X-axis so the frame body 141B faces the rear end portion 131B of the base portion 130. The longitudinal direction of the frame body 141C is provided parallel to the Y-axis so that the frame body 141C faces the left end portion 131C of the base portion 130 and the vibrating arm 121A, and both ends of the frame body 141C are connected to one of the ends of the frame bodies 141A and 141B, respectively. The longitudinal direction of the frame body 141D is provided parallel to the Y-axis so that the frame body 141D faces the right end portion 131D of the base portion 130 and the vibrating arm 121D, and both ends of the frame body 141D are connected to the other ends of the frame bodies 141A and 141B, respectively. The frame body 141A and the frame body 141B face each other in the Y-axis direction with the vibrating portion 110 interposed therebetween. The frame body 141C and the frame body 141D face each other in the X-axis direction with the vibrating portion 110 interposed therebetween.

The support arm 150 (e.g. a connecting arm or member) is disposed inside the holding portion 140 and connects the base portion 130 and the holding portion 140. The support arm 150 is formed plane-symmetrically with respect to the virtual plane P. Specifically, the support arm 150 includes the left support arm 151A and the right support arm 151B in a plan view. The left support arm 151A connects the rear end portion 131B of the base portion 130 and the frame body 141C of the holding portion 140. The right support arm 151B connects the rear end portion 131B of the base portion 130 and the frame body 141D of the holding portion 140.

As further shown, the left support arm 151A includes a support rear arm 152A and a support side arm 153A, and the right support arm 151B includes a support rear arm 152B and a support side arm 153B. The support rear arms 152A and 152B extend from the rear end portion 131B of the base portion 130 between the rear end portion 131B of the base portion 130 and the holding portion 140. Specifically, one end of the support rear arm 152A is connected to the rear end portion 131B of the base portion 130, and the support rear arm 152A extends therefrom toward the frame body 141B. Then, the support rear arm 152A bends in the X-axis direction and extends toward the frame body 141C. One end of the support rear arm 152B is connected to the rear end portion 131B of the base portion 130, and the support rear arm 152B extends therefrom toward the frame body 141B. Then, the support rear arm 152B bends in the X-axis direction and extends toward the frame body 141D.

The support side arm 153A extends in parallel with the vibrating arm 121A between the vibrating arm 121A and the holding portion 140. The support side arm 153B extends in parallel with the vibrating arm 121D between the vibrating arm 121D and the holding portion 140. Specifically, the support side arm 153A extends from the other end of the support rear arm 152A (end on the frame body 141C side) toward the frame body 141A in the Y-axis direction, bends in the X-axis direction, and is connected to the frame body 141C. The support side arm 153B extends from the other end of the support rear arm 152B (end on the frame body 141D side) toward the frame body 141A in the Y-axis direction, bends in the X-axis direction, and is connected to the frame body 141D.

The support side arms 153A and 153B are respectively connected to the frame body 141C and the frame body 141D at positions facing the arm portions 123A to 123D in the X-axis direction. In other words, the connection position between the support side arm 153A and the frame body 141C and the connection position between the support side arm 153B and the frame body 141D are shifted from a center line CL of the vibrating portion 110, that is, the vibrating arms 121A to 121D and the base portion 130, in the Y-axis direction toward the base portion 130 side in a plan view. As a result, lengths of the support side arms 153A and 153B in the Y-axis direction are shortened.

Moreover, according to the exemplary aspect, the protruding portion 50 protrudes from the recess 21 of the lower lid 20 into the vibration space. The protruding portion 50 is disposed between the arm portion 123B of the vibrating arm 121B and the arm portion 123C of the vibrating arm 121C in a plan view. The protruding portion 50 extends in the Y-axis direction in parallel with the arm portions 123B and 123C, and is formed in a prismatic shape. A length of the protruding portion 50 in the Y-axis direction is approximately 240 µm, and a length thereof in the X-axis direction is approximately 15 µm. Moreover, it is noted that the number of protruding portions 50 is not limited to one, and may be two or more. As described above, since the protruding portion 50 is disposed between the vibrating arm 121B and the vibrating arm 121C, and protrudes from the bottom plate 22 of the recess 21, the rigidity of the lower lid 20 can be increased, whereby the deflection of the resonator 10 formed on the lower lid 20 and the occurrence of the warpage of the lower lid 20 can be suppressed.

Figure 4:
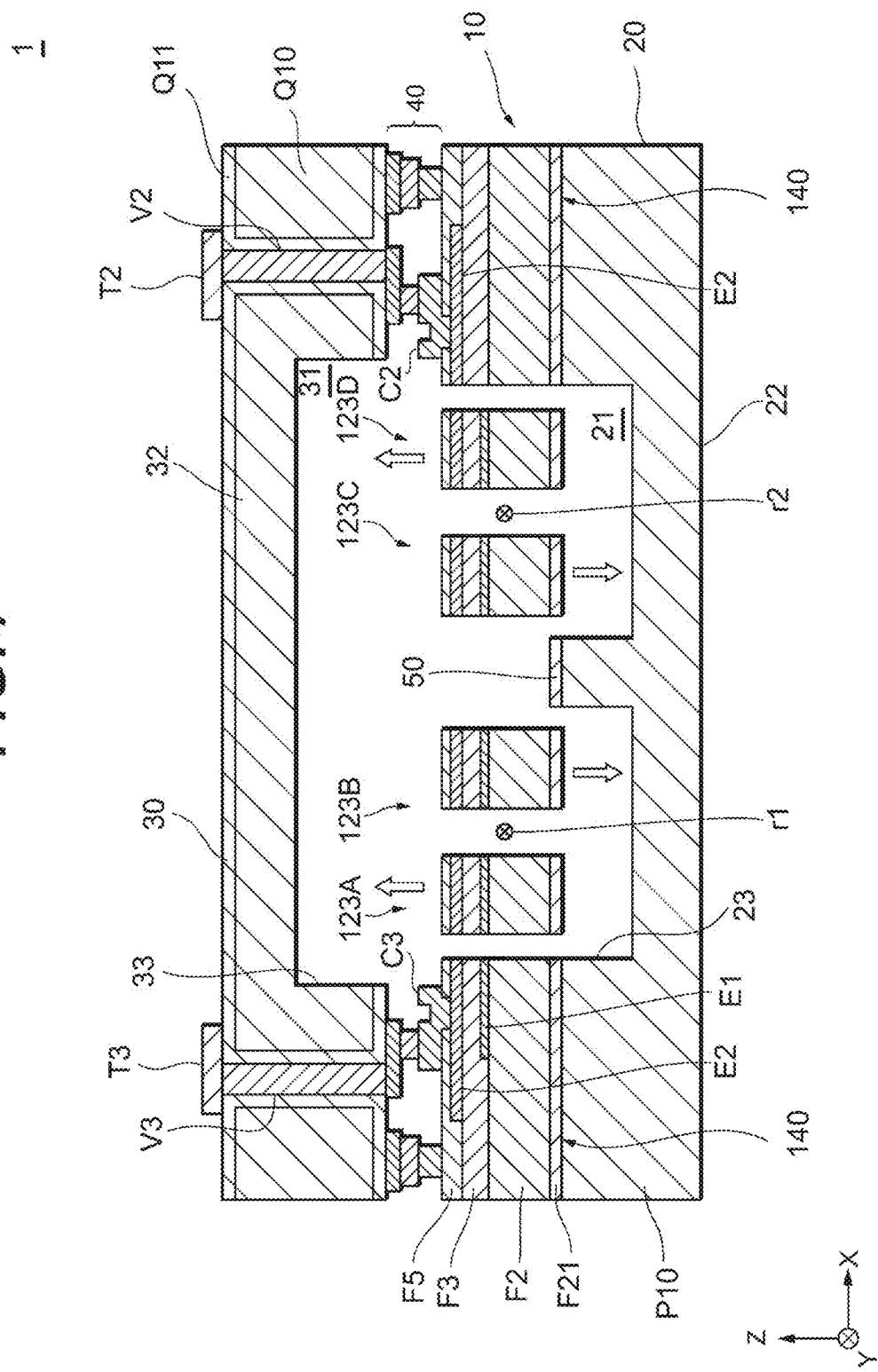
FIG. 4 is a sectional view taken along the X-axis schematically illustrating the laminated structure of the resonance device illustrated in FIG. 1.
Figure 5:
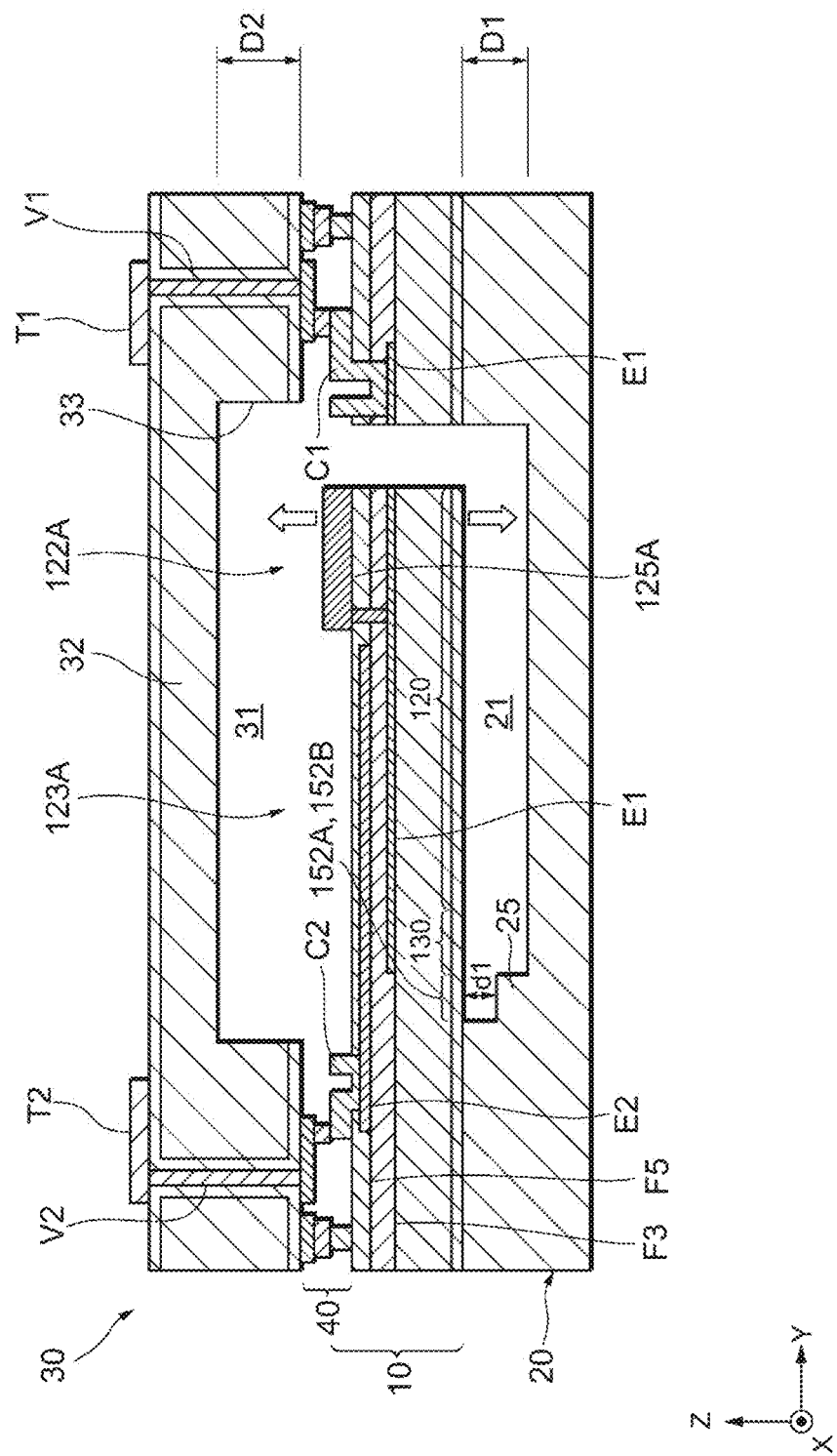
FIG. 5 is a sectional view taken along the Y-axis schematically illustrating the laminated structure of the resonance device illustrated in FIG. 1.

Next, with reference to FIGS. 4 and 5, the laminated structure and operation of the resonance device according to the first embodiment of the present invention will be described. FIG. 4 is a sectional view taken along the X-axis schematically illustrating the laminated structure of the resonance device 1 illustrated in FIG. 1. FIG. 5 is a sectional view taken along the Y-axis conceptually illustrating the laminated structure of the resonance device 1 illustrated in FIG. 1.

In the resonance device 1, the holding portion 140 of the resonator 10 is bonded on the side wall 23 of the lower lid 20, and the holding portion 140 of the resonator 10 and the side wall 33 of the upper lid 30 are further bonded together. In this manner, the resonator 10 is held between the lower lid 20 and the upper lid 30, and the vibration space in which the vibrating portion 110 vibrates is formed by the lower lid 20, the upper lid 30, and the holding portion 140 of the resonator 10.

The vibrating portion 110, the holding portion 140, and the support arm 150 in the resonator 10 are integrally formed in the same process. In the resonator 10, a metal film E1 is laminated on a Si substrate F2 which is an example of a substrate. A piezoelectric film F3 is laminated on the metal film E1 so as to cover the metal film E1, and a metal film E2 is laminated on the piezoelectric film F3. A protective film F5 is laminated on the metal film E2 so as to cover the metal film E2. In the mass addition portions 122A to 122D, the above-described mass addition films 125A to 125D are laminated on the protective film F5, respectively. Moreover, the outer shape of each of the vibrating portion 110, the holding portion 140, and the support arm 150 is formed by patterning a multilayer body including the Si substrate F2, the metal film E1, the piezoelectric film F3, the metal film E2, the protective film F5, and the like described above, in a removal process by dry etching in which the multilayer body is irradiated with, for example, an argon (Ar) ion beam.

In the present embodiment, the example in which the resonator 10 includes the metal film E1 is described. However, it is noted that the present invention is not limited thereto. For example, in the resonator 10, by using a degenerate silicon substrate having low resistance as the Si substrate F2, the Si substrate F2 itself can also serve as the metal film E1, and the metal film E1 may be omitted.

The Si substrate F2 is formed of, for example, a degenerate n-type silicon semiconductor having a thickness of approximately 6 μm, and may contain phosphorus (P), arsenic (As), antimony (Sb), or the like as n-type dopants. The degenerate silicon (Si) used for the Si substrate F2 has a resistance value of, for example, less than 1.6 mΩ·cm, more preferably 1.2 mΩ·cm or less. Further, on a lower surface of the Si substrate F2, a silicon oxide layer F21 such as SiO$_2$ is formed as an example of a temperature characteristics correction layer. This configuration improves the temperature characteristics.

In the present embodiment, the silicon oxide layer F21 refers to a layer having a function of reducing the temperature coefficient of the frequency of the vibrating portion 110, that is, the rate of change of the frequency per temperature, when a temperature correction layer is formed on the Si substrate F2, at least near room temperature, as compared with a case where the silicon oxide layer F21 is not formed on the Si substrate F2. Since the vibrating portion 110 includes the silicon oxide layer F21, for example, it is possible to reduce a change with temperature in the resonant frequency of the laminated structure body including the Si substrate F2, the metal films E1 and E2, the piezoelectric film F3, and the silicon oxide layer F21. Moreover, the silicon oxide layer may be formed on the upper surface of the Si substrate F2, or may be formed on both the upper surface and the lower surface of the Si substrate F2.

The silicon oxide layer F21 of the mass addition portions 122A to 122D is preferably formed with uniform thickness. For purposes of this disclosure, uniform thickness here means that the variations in the thickness of the silicon oxide layer F21 is within a range of ±20% from the mean value of the thickness.

Each of the metal films E1 and E2 includes an excitation electrode for exciting the vibrating arms 121A to 121D, and an extended electrode for electrically connecting the excitation electrode to an external power supply. Regions of the metal films E1 and E2 that function as the excitation electrodes face each other with the piezoelectric film F3 interposed therebetween in the arm portions 123A to 123D of the vibrating arms 121A to 121D. Regions of the metal films E1 and E2 that function as the extended electrodes are extended out from, for example, the base portion 130 to the holding portion 140 via the support arm 150. The metal film E1 is electrically continuous over the entire resonator 10. Regions of the metal film E2 that are included in the vibrating arms 121A and 121D and regions of the metal film E2 that are included in the vibrating arms 121B and 121C are electrically separated from each other.

According to the exemplary aspect, thickness of each of the metal films E1 and E2 is, for example, approximately 0.1 μm or more and approximately 0.2 μm or less. After being formed, the metal films E1 and E2 are patterned into the excitation electrodes, the extended electrodes, and the like by a removal process such as etching. The metal films E1 and E2 are formed of, for example, a metal material having a body-centered cubic crystal structure. Specifically, the metal films E1 and E2 are formed of molybdenum (Mo), tungsten (W), or the like. As described above, since the metal films E1 and E2 are mainly composed of metal whose crystal structure is a body-centered cubic crystal structure, the metal films E1 and E2 suitable for the lower electrode and the upper electrode of the resonator 10 can be easily obtained.

The piezoelectric film F3 is a thin film formed of a piezoelectric material that converts electrical energy and mechanical energy into each other. In particular, the piezoelectric film F3 expands and contracts in the Y-axis direction of the in-plane directions of the XY plane according to the electric field generated in the piezoelectric film F3 by the metal films E1 and E2. By the expansion and contraction of the piezoelectric film F3, the open ends of the vibrating arms 121A to 121D are displaced toward the bottom plate 22 of the lower lid 20 and the bottom plate 32 of the upper lid 30, respectively. Therefore, the resonator 10 vibrates in the out-of-plane bending vibration mode.

In the exemplary aspect, the thickness of the piezoelectric film F3 is, for example, approximately 1 μm but may be approximately 0.2 μm to 2 μm. The piezoelectric film F3 is formed of a material having a wurtzite crystal structure. For example, a nitride or oxide such as aluminum nitride (AlN), scandium aluminum nitride (ScAlN), zinc oxide (ZnO), gallium nitride (GaN), and indium nitride (InN) can be used as a main component. It is noted that scandium aluminum nitride is obtained by replacing part of aluminum in aluminum nitride with scandium, and scandium may be replaced with two elements such as magnesium (Mg) and niobium (Nb), or magnesium (Mg) and zirconium (Zr). As described above, since the piezoelectric film F3 is mainly composed of a piezoelectric material whose crystal structure is a wurtzite crystal structure, the piezoelectric film F3 suitable for the resonator 10 can be easily obtained.

The protective film F5 protects the metal film E2 from oxidation. Moreover, the protective film F5 does not have to be visible from the bottom plate 32 side of the upper lid 30 as long as the protective film F5 is provided on the upper lid 30 side. For example, a parasitic capacitance reduction film or the like that reduces the capacitance of the wiring formed in the resonator 10 may be formed so as to cover the protective film F5. The protective film F5 is formed of, for example, a piezoelectric film, such as aluminum nitride (AlN), scandium aluminum nitride (ScAlN), zinc oxide (ZnO), gallium nitride (GaN), or indium nitride (InN), or an insulating film such as silicon nitride (SiN), silicon oxide (SiO$_2$), alumina oxide (Al$_2$O$_3$), or tantalum pentoxide (Ta$_2$O$_5$). A thickness of the protective film F5 is formed to be half or less than half the thickness of the piezoelectric film F3, and is, for example, approximately 0.2 μm in the present embodiment. More preferably, the thickness of the protective film F5 is approximately one fourth of the thickness of the piezoelectric film F3. Further, when the protective film F5 is formed of a piezoelectric material such as aluminum nitride (AlN), it is preferable to use a piezoelectric material having the same orientation as the piezoelectric film F3.

The protective film F5 of the mass addition portions 122A to 122D is preferably formed with uniform thickness. As noted above, the uniform thickness herein means that the variations in the thickness of the protective film F5 is within a range of ±20% from the mean value of the thickness.

The mass addition films 125A to 125D form the surfaces of the mass addition portions 122A to 122D on the upper lid 30 side, respectively, and correspond to the frequency adjustment films of the vibrating arms 121A to 121D, respectively. The frequency of the resonator 10 is adjusted by trimming to remove a part of each of the mass addition films 125A to 125D. From the viewpoint of efficiency in adjusting frequency, the mass addition films 125A to 125D are preferably formed of a material having a faster mass reduction rate by etching than the protective film F5. The mass reduction rate is expressed by the product of the etching rate and the density. The etching rate here is the thickness removed per unit time. The magnitude relationship between the etching rate of the protective film F5 and the etching rate of the mass addition films 125A to 125D may be adjusted as desired as long as the relationship between the mass reduction rate of the protective film F5 and the mass reduction rate of the mass addition films 125A to 125D is as described above. From the viewpoint of efficiently increasing the weights of the mass addition portions 122A to 122D, the mass addition films 125A to 125D are preferably formed of a material having a high specific gravity. For these reasons, the mass addition films 125A to 125D are formed of a metal material such as molybdenum (Mo), tungsten (W), gold (Au), platinum (Pt), nickel (Ni), aluminum (Al), titanium (Ti) or the like.

A part of the upper surface of each of the mass addition films 125A to 125D is removed by trimming in the frequency-adjusting step. The trimming of the mass addition films 125A to 125D can be performed by, for example, dry etching by irradiating an argon (Ar) ion beam. Since the ion beam can irradiate a wide range, excellent processing efficiency can be obtained. Meanwhile, the mass addition films 125A to 125D may be charged due to the electric charge of the ion beam. The mass addition films 125A to 121A are preferably grounded in order to prevent the vibration characteristics of the resonator 10 from deteriorating due to changes in the vibration trajectories of the vibrating arms 121D to 125A caused by the Coulomb interaction due to the charging of the mass addition films 125A to 125D.

Extended lines C1, C2, and C3 are formed on the protective film F5 of the holding portion 140. The extended line C1 is electrically connected to the metal film E1 through a through hole extending through both the piezoelectric film F3 and the protective film F5. The extended line C2 is electrically connected to portions of the metal film E2 formed on the vibrating arms 121A and 121D through a through hole extending through the protective film F5. The extended line C3 is electrically connected to portions of the metal film E2 formed on the vibrating arms 121B and 121C through a through hole extending through the protective film F5. The extended lines C1 to C3 are formed of a metal material such as aluminum (Al), germanium (Ge), gold (Au), or tin (Sn).

In the present embodiment, FIG. 4 illustrates an example in which the arm portions 123A to 123D, the extended lines C2 and C3, through electrodes V2 and V3, and the like are located on the same cross-section plane, but these are not necessarily located on the same cross-section plane. For example, the through electrodes V2 and V3 may be formed at positions apart in the Y-axis direction from the cross-section that is parallel to the ZX plane defined by the Z-axis and the X-axis, and that cuts the arm portions 123A to 123D.

Similarly, in the present embodiment, FIG. 5 illustrates an example in which the mass addition portion 122A, the arm portion 123A, the extended lines C1 and C2, the through electrodes V1 and V2, and the like are located on the same cross-section plane, but these components are not necessarily located on the same cross-section plane.

The bottom plate 22 and the side wall 23 of the lower lid 20 are integrally formed of a Si substrate P10. The Si substrate P10 is formed of non-degenerate silicon and has a resistivity of, for example, 10 •·cm or more. Inside the recess 21 of the lower lid 20, the Si substrate P10 is visibly provided. The silicon oxide layer F21 is formed on the upper surface of the protruding portion 50. However, from the viewpoint of suppressing the charging of the protruding portion 50, the Si substrate P10 having a lower electric resistivity than the silicon oxide layer F21 may be visibly provided on the upper surface of the protruding portion 50, or a conductive layer may be formed thereon.

A thickness of the lower lid 20 defined in the Z-axis direction is approximately 150 μm, and a depth D1 of the recess 21 similarly defined is approximately 50 μm. Since the amplitude of each of the vibrating arms 121A to 121D is limited to the depth D1, the maximum amplitude on the lower lid 20 side is approximately 50 μm.

Moreover, the limiting portion 25 is provided away from the support arm 150 of the resonator 10 by a first distance d1 in the thickness direction of the lower lid 20 along the Z-axis direction. Specifically, the limiting portion 25 has a step to form a height difference with the bottom surface of the recess 21, and is formed integrally with the lower lid 20. In the exemplary aspect, the limiting portion 25 is provided at a position facing the support rear arms 152A and 152B of the support arm 150. Therefore, when vibrating in the Z-axis direction, the maximum amplitude of the support arm 150 on the lower lid 20 side is limited to the first distance d1. The first distance d1 is, for example, approximately 5 μm to approximately 15 μm.

The lower lid 20 can also be regarded as a part of an SOI substrate. When a MEMS substrate is considered to be formed of an SOI substrate in which the resonator 10 and the lower lid 20 are integrated, the Si substrate P10 of the lower lid 20 corresponds to a support substrate of the SOI substrate, the silicon oxide layer F21 of the resonator 10 corresponds to a BOX layer of the SOI substrate, and the Si substrate F2 of the resonator 10 corresponds to an active layer of the SOI substrate. At this time, various semiconductor elements, circuits, and the like may be formed on the outer side portion of the resonance device 1 by using a part of the continuous MEMS substrate.

The bottom plate 32 and the side wall 33 of the upper lid 30 are integrally formed of the Si substrate Q10. A front surface and a back surface and inner surfaces of the through holes of the upper lid 30 are preferably covered with a silicon oxide film Q11. The silicon oxide film Q11 is formed on the surface of the Si substrate Q10 by, for example, oxidation of the Si substrate Q10 or chemical vapor deposition (CVD). Inside the recess 31 of the upper lid 30, the Si substrate Q10 is visibly provided. A getter layer may be formed on the surface of the recess 31 of the upper lid 30 on the side facing the resonator 10. The getter layer is formed of, for example, titanium (Ti) or the like. The getter layer sucks outgas released from a bonding portion 40, which will be described later, and the like, and suppresses a decrease in the degree of vacuum in the vibration space. The getter layer may be formed on the surface of the recess 21 of the lower lid 20 on the side facing the resonator 10, or may be formed on the surfaces of both the recess 21 of the lower lid 20 and the recess 31 of the upper lid 30 on the sides facing the resonator 10.

A thickness of the upper lid 30 defined in the Z-axis direction is approximately 150 μm, and a depth D2 of the recess 31 defined in the same manner is approximately 50 μm. Since the amplitude of each of the vibrating arms 121A to 121D is limited to the depth D2, the maximum amplitude on the upper lid 30 side is approximately 50 μm.

Terminals T1, T2, and T3 are formed on an upper surface (i.e., a surface opposite to the surface facing the resonator 10) of the upper lid 30. The terminal T1 is a mounting terminal for grounding the metal film E1. The terminal T2 is a mounting terminal for electrically connecting the metal film E2 of the vibrating arms 121A and 121D to an external power supply. The terminal T3 is a mounting terminal for electrically connecting the metal film E2 of the vibrating arms 121B and 121C to the external power supply. The terminals T1 to T3 are formed by plating a metallized layer (base layer) of chromium (Cr), tungsten (W), nickel (Ni), or the like with nickel (Ni), gold (Au), silver (Ag), copper (Cu), or the like. Moreover, a dummy terminal electrically insulated from the resonator 10 may be formed on the upper surface of the upper lid 30 for the purpose of adjusting parasitic capacitance and mechanical strength balance according to exemplary aspects.

The through electrodes V1, V2, and V3 are formed inside the side wall 33 of the upper lid 30. The through electrode V1 electrically connects the terminal T1 and the extended line C1, the through electrode V2 electrically connects the terminal T2 and the extended line C2, and the through electrode V3 electrically connects the terminal T3 and the extended line C3. The through electrodes V1 to V3 are formed by filling a conductive material into through holes that extend through the side wall 33 of the upper lid 30 in the Z-axis direction. The conductive material to be filled is, for example, polycrystalline silicon (Poly-Si), copper (Cu), gold (Au), or the like.

A bonding portion 40 is formed between the side wall 33 of the upper lid 30 and the holding portion 140, and the upper lid 30 is bonded to the resonator 10 by the bonding portion 40. The bonding portion 40 is formed in a closed ring shape surrounding the vibrating portion 110 in the XY plane so as to hermetically seal the vibration space for the resonator 10 in a vacuum state. The bonding portion 40 is formed of a metal film in which, for example, an aluminum (Al) film, a germanium (Ge) film, and an aluminum (Al) film are laminated in this order and eutectic bonded. The bonding portion 40 may be formed of a combination of films appropriately selected from gold (Au), tin (Sn), copper (Cu), titanium (Ti), silicon (Si), and the like. In order to enhance adhesive properties, the bonding portion 40 may include a metal compound such as titanium nitride (TiN) or tantalum nitride (TaN) between the films.

In the present embodiment, the terminal T1 is grounded, and alternating voltages having phases opposite to each other are applied to the terminal T2 and the terminal T3. Therefore, the phase of the electric field formed in the piezoelectric film F3 of the vibrating arms 121A and 121D and the phase of the electric field formed in the piezoelectric film F3 of the vibrating arms 121B and 121C are opposite to each other. Accordingly, the outer vibrating arms 121A and 121D and the inner vibrating arms 121B and 121C are displaced in directions opposite to each other. For example, when the mass addition portions 122A and 122D of the vibrating arms 121A and 121D are displaced toward the inner surface of the upper lid 30, the mass addition portions 122B and 122C of the vibrating arms 121B and 121C are displaced toward the inner surface of the lower lid 20. In this manner, the vibrating arm 121A and the vibrating arm 121B vibrate in vertically opposite directions around a central axis r1 extending in the Y-axis direction between the vibrating arm 121A and the vibrating arm 121B adjacent to each other. In addition, the vibrating arm 121C and the vibrating arm 121D vibrate in vertically opposite directions around a central axis r2 extending in the Y-axis direction between the vibrating arm 121C and the vibrating arm 121D adjacent to each other. As a result, torsional moments in directions opposite to each other are generated in the central axes r1 and r2, and bending vibration occurs at the base portion 130. The maximum amplitudes of the vibrating arms 121A to 121D are approximately 50 μm, and the amplitudes during normal driving are approximately 10 μm.

In addition, as described above, the connection positions of the support side arms 153A and 153B and the holding portion 140 are shifted toward the base portion 130 side from the center line CL of the vibrating arms 121A to 121D and the base portion 130 in the Y-axis direction in a plan view, and the lengths of the support side arms 153A and 153B in the Y-axis direction are shortened. With this configuration, in the vibration in the main mode, the support rear arms 152A and 152B hardly vibrate. Therefore, the amplitudes of the support rear arms 152A and 152B in the Z-axis direction can be reduced.

Here, the relationship between the vibration of the resonator 10 and the depths at the recess 21 and the limiting portion 25 will be described.

Generally, ultrasonic welding may be used in the manufacturing process or implementation of the resonance device 1. In general, ultrasonic welding is a processing technology in which thermo-plastic resins are instantaneously melted and bonded by, for example, fine ultrasonic vibration of approximately 20 kHz to approximately 40 kHz and a pressing force. In the defluxing after the reflow soldering, ultrasonic cleaning may be performed at, for example, approximately 28 kHz to approximately 45 kHz. In a case in which an electronic apparatus including the resonance device 1 is mounted on a vehicle, for example, when the vehicle travels on pebbles, ultrasonic vibration may be generated in the electronic apparatus as spike noise.

When such ultrasonic vibration is applied to the resonator 10, the support arm 150 may violently vibrate in the vertical direction due to a spurious mode existing in the frequency region of the ultrasonic vibration. As a result, a large stress is applied to the connecting portion between the support arm 150 and the holding portion 140, which may damage or destroy the resonator 10, such as breaking the connecting portion or the periphery of the connecting portion.

On the other hand, in the present embodiment, as illustrated in FIG. 5, the limiting portion 25 is provided away from the support arm 150 by the first distance d1, and the first distance d1 is smaller than the depth D1 from the bottom surface of the recess 21 to the vibrating arms 121A to 121D in the thickness direction of the lower lid 20. With this configuration, when ultrasonic vibration is applied to the resonator 10, the vibration of the support arm 150 in the Z-axis direction is limited by the limiting portion 25. Therefore, the amplitude of the support arm 150 is reduced as compared with the case where the limiting portion 25 is not provided. Accordingly, the stress applied to the connecting portion between the support arm 150 and the holding portion 140 can be reduced, and breakage and destruction of the resonator 10 can be suppressed.

Moreover, according to the exemplary embodiment, the first distance d1 is preferably 1/10 or more of the depth D1 and less than the depth D1, and more preferably 1/10 or more of the depth D1 and 3/10 or less of the depth D1. As described above, since the first distance d1 is 1/10 or more of the depth D1 and less than the depth D1, the resonance device 1 can be provided that reduces the stress applied to the connecting portion between the support arm 150 and the holding portion 140.

During the operation of the resonance device 1, the vibrating arms 121A to 121D vibrate in the main mode, and the left support arm 151A and the right support arm 151B vibrate in the spurious mode. In the following description, the frequency of the main mode vibration generated in the vibrating arms 121A to 121D is defined as the frequency Fm, and the frequency of the spurious mode vibration generated in the support arm 150 is defined as the frequency Fs.

Figure 6:
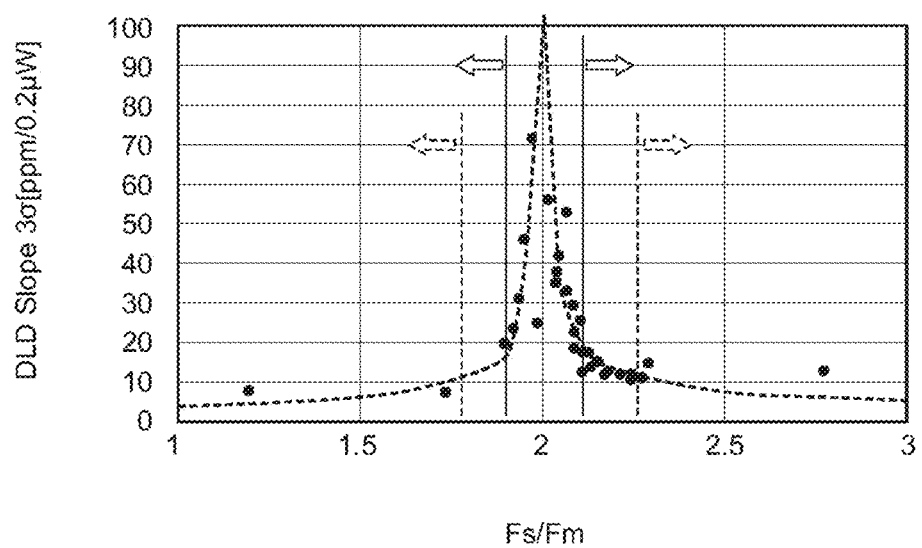
FIG. 6 is a graph representing the relationship between the frequency ratio and the DLD variations.

Next, the relationship between the ratio of the frequency of the spurious mode to the frequency of the main mode and drive level dependency (DLD) will be described with reference to FIG. 6. FIG. 6 is a graph representing the relationship between the frequency ratio and the DLD variation. In FIG. 6, the horizontal axis represents the frequency ratio Fs/Fm of the frequency Fs of the vibration in the spurious mode to the frequency Fm of the vibration in the main mode, and the vertical axis represents the value indicating the DLD variation (DLD Slope 3σ).

As illustrated in FIG. 6, the DLD Slope 3σ becomes worse as the frequency ratio Fs/Fm approaches 2. The DLD Slope 3σ in a range where the frequency ratio Fs/Fm is 1.8 or more and 2.2 or less (1.8≤Fs/Fm≤2.2) is larger than the DLD Slope 3σ in a range where the frequency ratio Fs/Fm is smaller than 1.8 (Fs/Fm<1.8) and where the frequency ratio Fs/Fm is larger than 2.2 (2.2<Fs/Fm). In particular, in a range where the frequency ratio Fs/Fm is 1.9 or more and 2.1 or less (1.9≤Fs/Fm≤2.1), the DLD Slope 3σ is particularly large. For example, in the example illustrated in FIG. 6, the DLD Slope 3σ in the range where 1.8≤Fs/Fm≤2.2 exceeds 10 ppm/0.2 µW, and the DLD Slope 3σ in the range where 1.9≤Fs/Fm≤2.1 exceeds 20 ppm/0.2 µW. Therefore, the frequency ratio Fs/Fm preferably satisfies the inequality Fs/Fm<1.8 or 2.2<Fs/Fm, and more preferably satisfies the inequality Fs/Fm<1.9 or 2.1<Fs/Fm.

The change in the slope of the approximate curve in the range where 1.8≤Fs/Fm≤2.2 is larger than the change in the slope of the approximate curve in the range where Fs/Fm<1.8 and the range where 2.2<Fs/Fm, and the change in the slope of the approximate curve is particularly large in the range where 1.9≤Fs/Fm≤2.1. Here, the slope of the approximate curve is the amount of change in the DLD Slope 3σ to the amount of change in the frequency ratio Fs/Fm. In other words, in the range where 1.8≤Fs/Fm≤2.2, when the frequency Fm or the frequency Fs changes due to manufacturing variations such as thickness variations of the piezoelectric film F3, the DLD Slope 3σ changes significantly. Therefore, the allowable ranges of the frequency Fs and the frequency Fm are smaller in the range where 1.8≤Fs/Fm≤2.2 than in the range where Fs/Fm<1.8 and the range where 2.2<Fs/Fm. That is, in order to lower the required processing accuracy and suppress the decrease in yield, the frequency ratio Fs/Fm preferably satisfies the inequality Fs/Fm<1.8 or 2.2<Fs/Fm, and more preferably satisfies the inequality Fs/Fm<1.9 or 2.1<Fs/Fm.

As described above, when the frequency ratio Fs/Fm satisfies the inequality 2.1<Fs/Fm, large DLD variations can be suppressed.

In the present embodiment, an example in which the resonance device 1 includes the limiting portion 25 having a stepped shape including a step has been described. However, it is noted that the exemplary embodiment of the present invention is not limited to this configuration. For example, the limiting portion may have a shape having an inclined surface, or may have a shape with rounded corners by round chamfering. The limiting portion 25 may have any other shape as long as the limiting portion 25 is provided away from the support arm 150 by the first distance d1 in the thickness direction of the lower lid 20.

<Modification>

Figure 7:
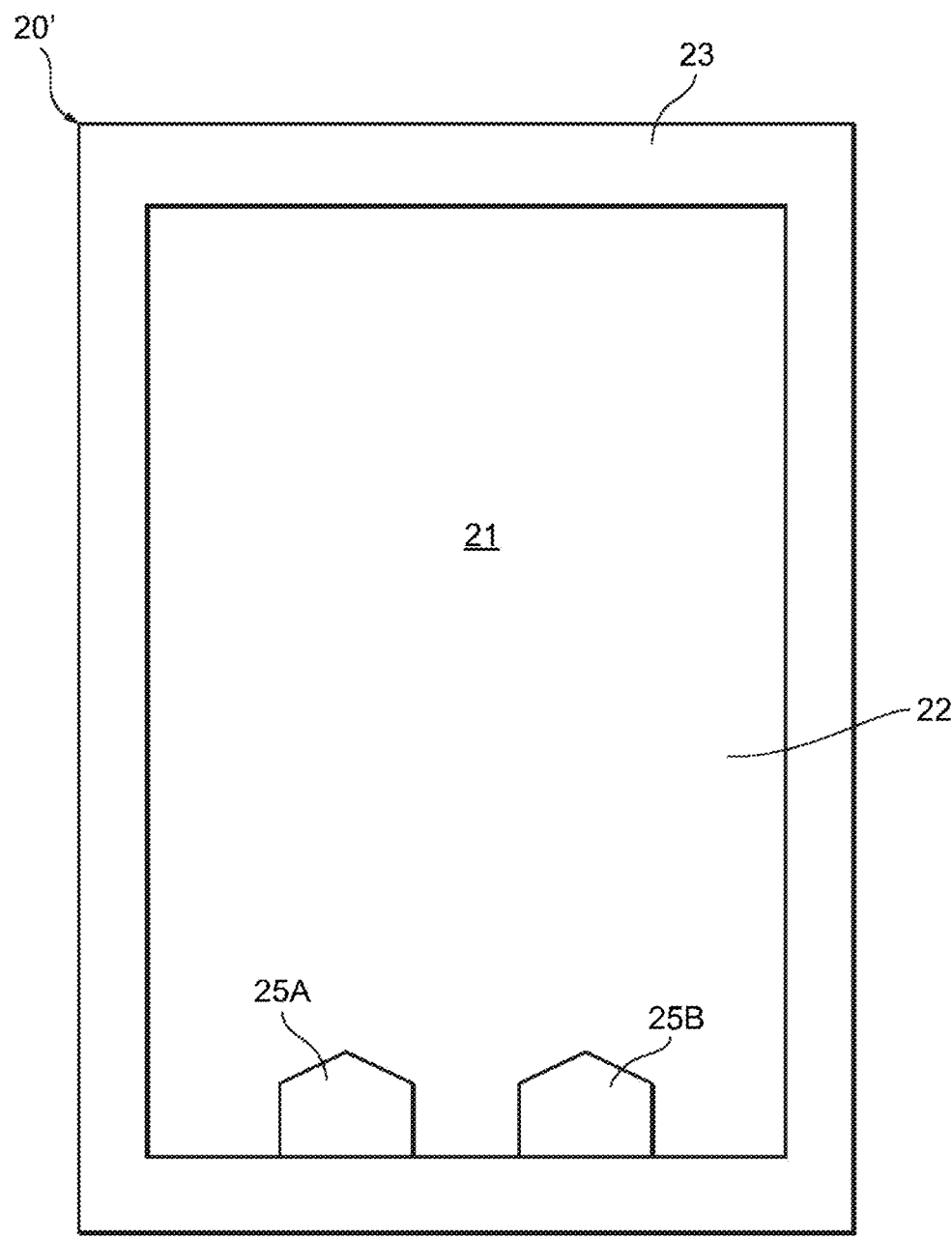
FIG. 7 is a plan view illustrating a modification of a lower lid illustrated in FIG. 2.

FIG. 7 is a plan view illustrating a modification of the lower lid 20 illustrated in FIG. 2.

As illustrated in FIG. 7, a lower lid 20' includes two limiting portions 25A and 25B. The limiting portions 25A and 25B protrude from the surface of the bottom plate 22, and each have a pentagonal shape in a plan view.

The limiting portions 25A and 25B are disposed away from the support arm 150 by the first distance d1 described above in the thickness direction of the lower lid 20' along the Z-axis direction. Specifically, the limiting portion 25A is disposed away from the connecting portion between the support rear arm 152A of the left support arm 151A and the rear end portion 131B of the base portion 130 by the first distance d1. Similarly, the limiting portion 25B is disposed away from the connecting portion between the support rear arm 152B of the right support arm 151B and the rear end portion 131B of the base portion 130 by the first distance d1. In this way, the limiting portions 25A and 25B are provided away from at least the support rear arms 152A and 152B of the support arm 150 by the first distance d1 in the thickness direction of the lower lid 20' along the Z-axis direction. As a result, the stress applied to the connecting portion between the support arm 150 and the holding portion 140 can be reduced, and the volume of the recess 21 can be increased.

Second Exemplary Embodiment

Next, a resonance device according to a second exemplary embodiment will be described with reference to FIGS. 8 to 11. In the following embodiments, the same or similar configurations as those in the first embodiment will be denoted by the same or similar reference numerals, and differences from the first embodiment will be described. In addition, the same operation and effect by the same configuration will not be described one by one.

Figure 8:
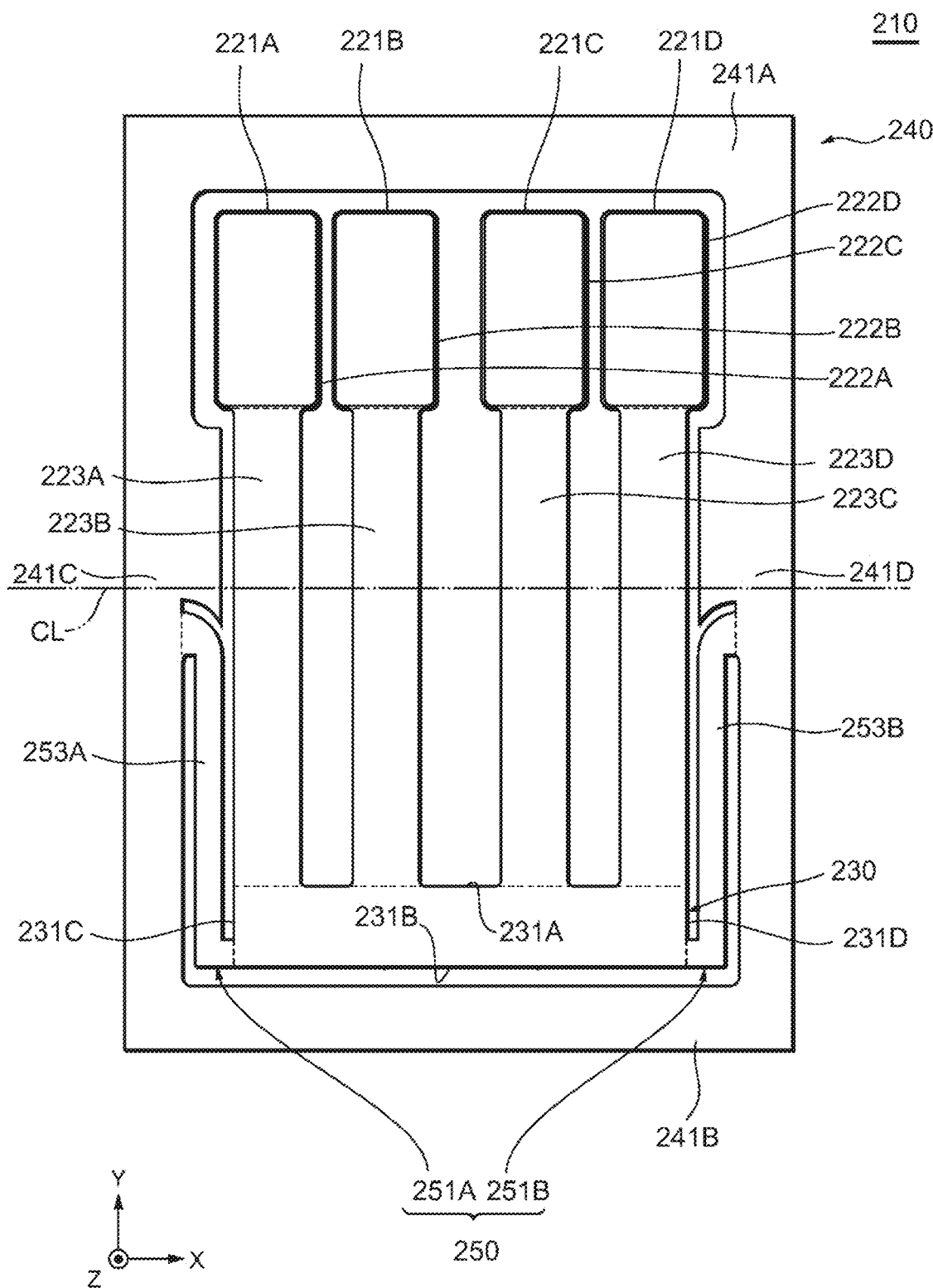
FIG. 8 is a plan view schematically illustrating the structure of a resonator according to a second exemplary embodiment.

First, a schematic configuration of a resonator according to the second embodiment of the present invention will be described with reference to FIG. 8. FIG. 8 is a plan view schematically illustrating the structure of a resonator 210 according to the second embodiment. It is noted that FIG. 8 is a plan view corresponding to FIG. 3 illustrating the first embodiment.

The resonator 210 of the second embodiment is different from the resonator 10 of the first embodiment in that a left support arm 251A and a right support arm 251B are connected to a left end portion 231C and a right end portion 231D of a base portion 230, respectively.

As illustrated in FIG. 8, the resonator 210 includes vibrating arms 221A to 221D, the base portion 230, a holding portion 240, and a support arm 250, similarly to the resonator 10 of the first embodiment. The vibrating arms 221A to 221D include mass addition portions 222A to 222D and arm portions 223A to 223D, respectively. The base portion 230 includes a front end portion 231A, a rear end portion 231B, the left end portion 231C, and the right end portion 231D. The holding portion 240 includes frame bodies 241A, 241B, 241C, and 241D. The support arm 250 includes the left support arm 251A and the right support arm 251B.

The left support arm 251A and the right support arm 251B do not include the support rear arms of the first embodiment illustrated in FIG. 3, but include the support side arms 253A and 253B, respectively. Specifically, one end of the support side arm 253A is connected to the left end portion 231C of the base portion 130, and the support side arm 253A extends therefrom toward the frame body 241C in the X-axis direction. Then, the support side arm 253A is bent in the Y-axis direction to extend toward the frame body 241A, and is bent in the X-axis direction to be connected to the frame body 241C. Similarly, one end of the support side arm 253B is connected to the right end portion 231D of the base portion 130, and the support side arm 253B extends therefrom toward the frame body 241D in the X-axis direction. Then, the support side arm 253B is bent in the Y-axis direction to extend toward the frame body 241A, and is bent in the X-axis direction to be connected to the frame body 241D.

Figure 9:
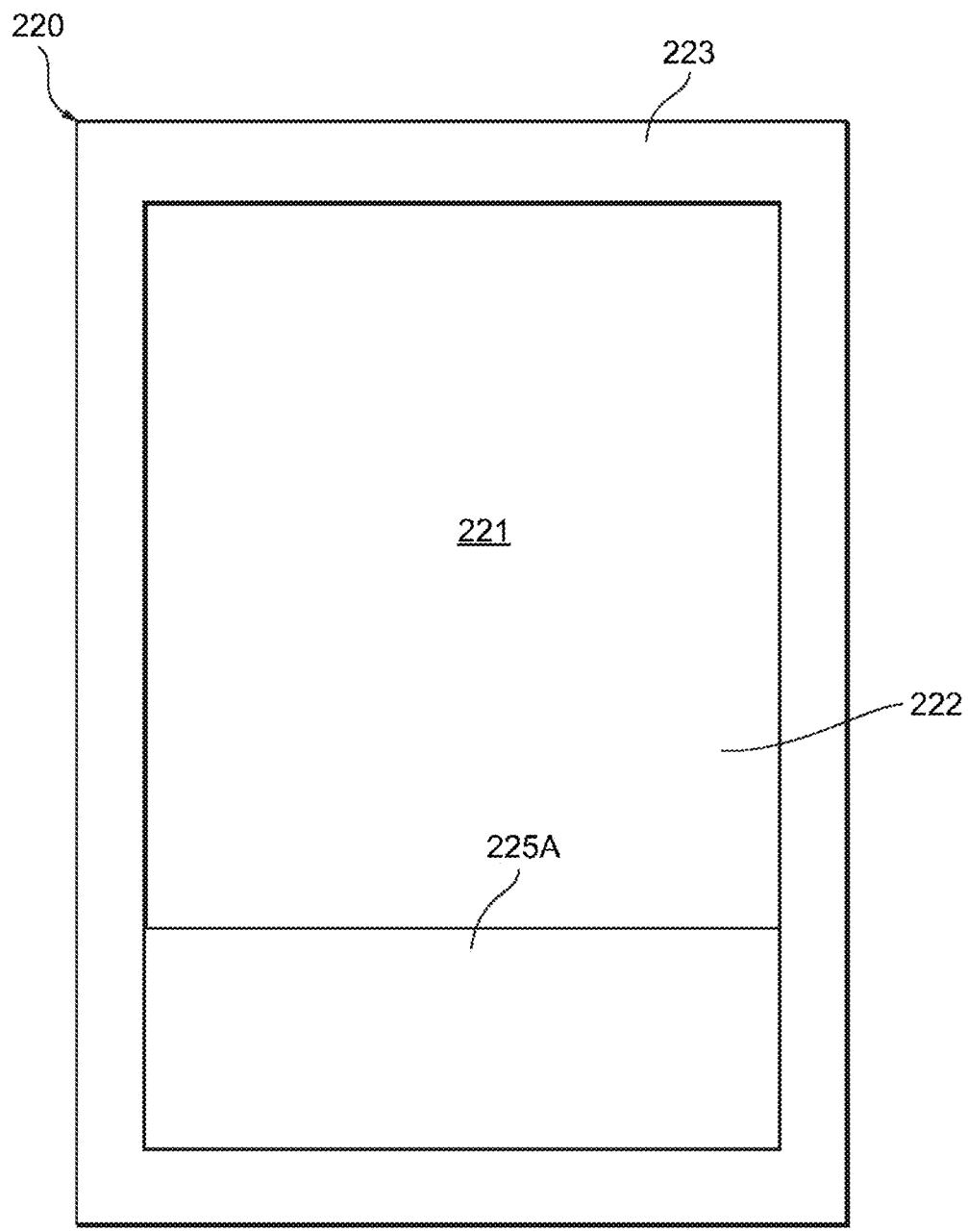
FIG. 9 is a plan view schematically illustrating a first example of a lower lid according to the second exemplary embodiment.
Figure 10:
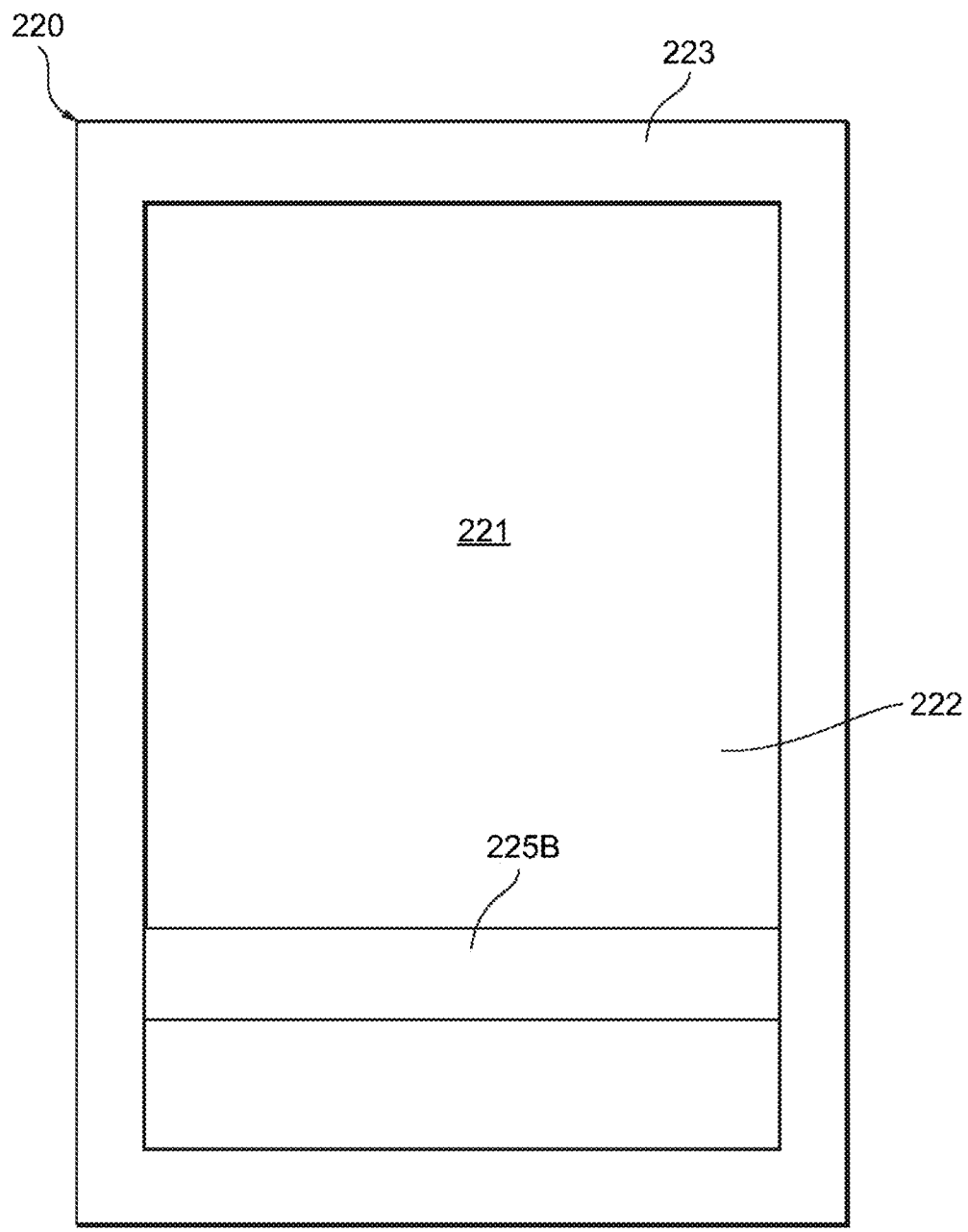
FIG. 10 is a plan view schematically illustrating a second example of the lower lid according to the second exemplary embodiment.
Figure 11:
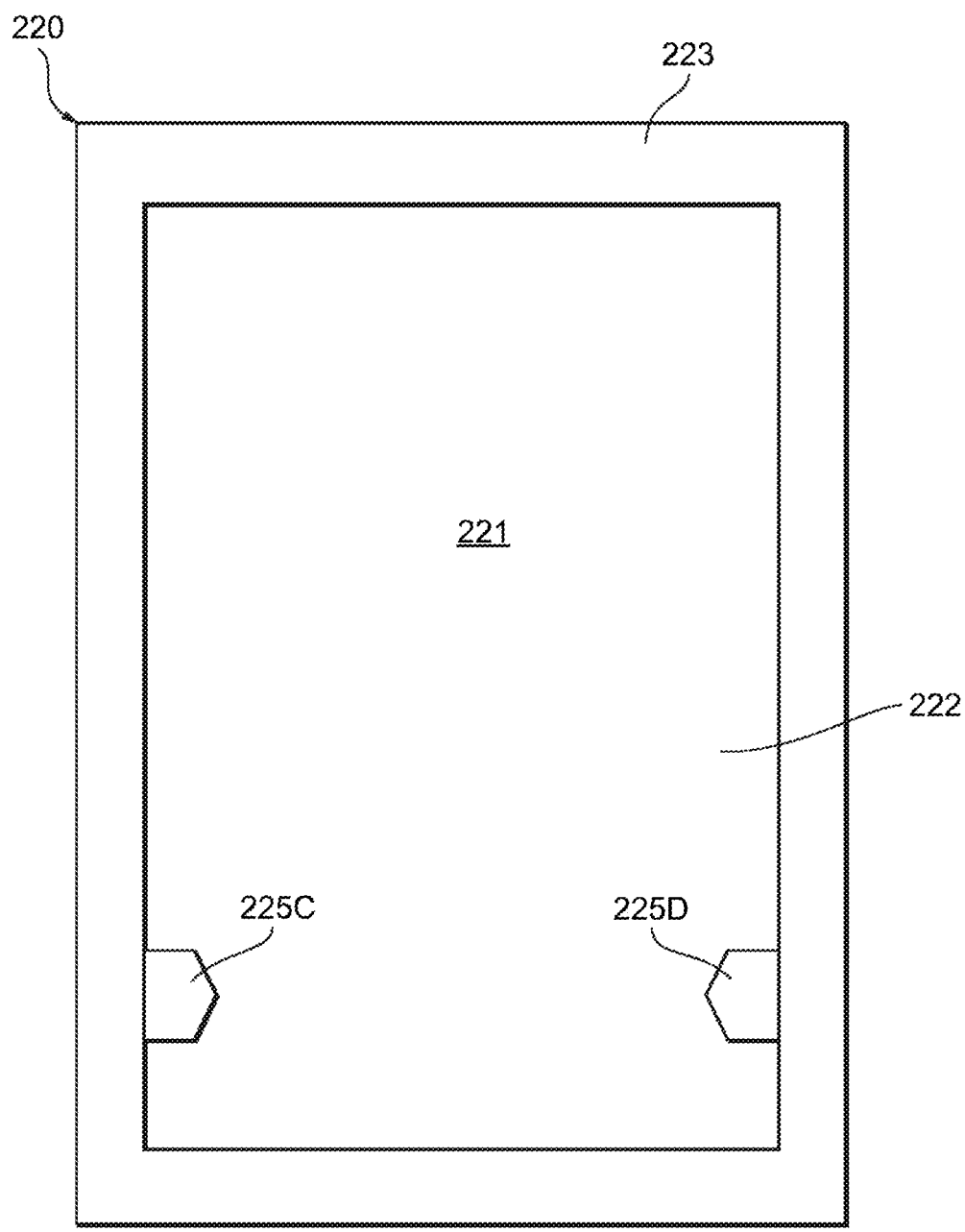
FIG. 11 is a plan view schematically illustrating a third example of the lower lid according to the second exemplary embodiment.

Next, a schematic configuration of a lower lid according to the second embodiment will be described with reference to FIGS. 9 to 11. FIG. 9 is a plan view schematically illustrating a first example of a lower lid 220 according to the second embodiment. FIG. 10 is a plan view schematically illustrating a second example of the lower lid 220 according to the second embodiment. FIG. 11 is a plan view schematically illustrating a third example of the lower lid 220 according to the second embodiment.

As illustrated in FIG. 9, the lower lid 220 includes a bottom plate 222 and a side wall 223, similarly to the lower lid 20 of the first embodiment. A recess 221 defined by a surface of the bottom plate 222 and an inner surface of the side wall 223 is formed on the surface of the lower lid 220 facing the resonator 210.

On the surface of the bottom plate 222, the protruding portion of the first embodiment is not formed, while a limiting portion 225A is provided as in the first embodiment. The limiting portion 225A is disposed away from at least the support side arms 253A and 253B of the support arm 250 by the first distance d1 in the thickness direction of the lower lid 220 along the Z-axis direction. With this configuration, the stress applied to the connecting portion between the support arm 250 and the holding portion 240 is reduced, and the support side arms 253A and 253B are connected to the left end portion 231C and the right end portion 231D of the base portion 230, respectively, so that the space of the base portion 230 on the rear end portion 231B side can be reduced, thus the size of the resonance device can be reduced in size.

As in the first embodiment, the shape of the limiting portion 225A is not limited to the example illustrated in FIG. 9.

For example, as illustrated in FIG. 10, the lower lid 220 may include a columnar limiting portion 225B extending in the X-axis direction.

As illustrated in FIG. 11, the lower lid 220 may include two limiting portions 225C and 225D. In this case, the limiting portion 225C is disposed away from the connecting portion between the support side arm 253A of the left support arm 251A and the left end portion 231C of the base portion 230 by the first distance d1. Similarly, the limiting portion 225D is disposed away from the connecting portion between the support side arm 253B of the right support arm 251B and the right end portion 231D of the base portion 230 by the first distance d1.

Third Exemplary Embodiment

Figure 12:
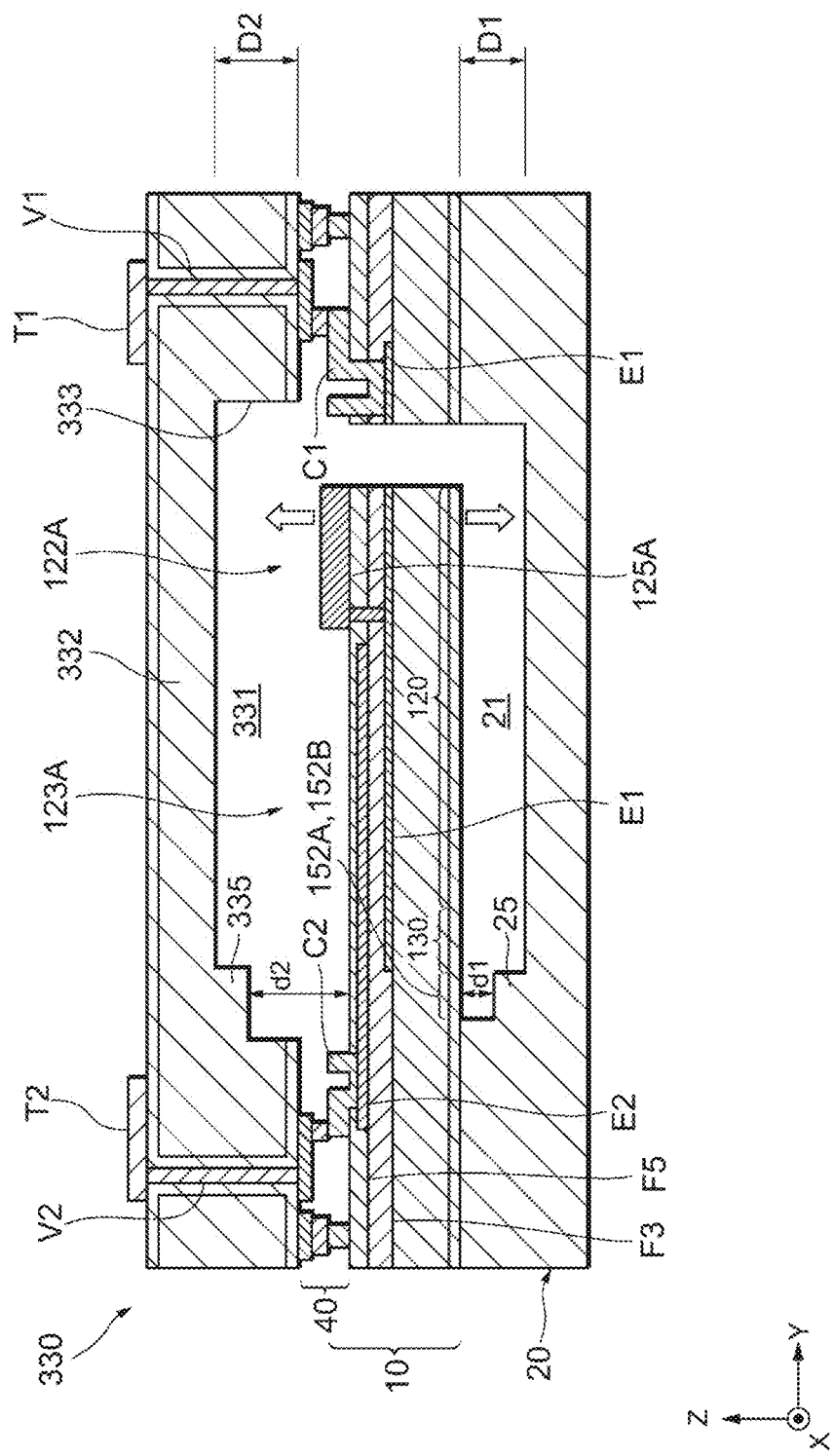
FIG. 12 is a sectional view taken along the Y-axis schematically illustrating the laminated structure of a resonance device according to a third exemplary embodiment.

Next, a resonance device according to a third exemplary embodiment will be described with reference to FIG. 12. FIG. 12 is a sectional view taken along the Y-axis conceptually illustrating the laminated structure of a resonance device 300 according to the third embodiment. FIG. 12 is a sectional view corresponding to FIG. 5 illustrating the first embodiment.

The resonance device 300 of the third embodiment is different from the resonance device 1 of the first embodiment in that an upper lid 330 includes a limiting portion 335.

As illustrated in FIG. 12, the upper lid 330 includes a bottom plate 332 and a side wall 333, similarly to the upper lid 30 of the first embodiment. A recess 331 defined by a surface of the bottom plate 332 and an inner surface of the side wall 333 is formed on the surface of the upper lid 330 facing the resonator 10.

As further shown, the upper lid 330 includes the limiting portion 335 provided on the surface of the bottom plate 332. The limiting portion 335 is disposed away from the support arm 150 of the resonator 10 by a second distance d2 in the thickness direction of the upper lid 330 along the Z-axis direction. Specifically, the limiting portion 335 has a step to form a height difference with the bottom surface of the recess 331, and is formed integrally with the upper lid 330. The limiting portion 335 is provided at a position facing the support rear arms 152A and 152B of the support arm 150. Therefore, when vibrating in the Z-axis direction, the maximum amplitude of the support arm 150 on the upper lid 330 side is limited to the second distance d2. In this exemplary aspect, the second distance d2 is, for example, approximately 5 μm to approximately 40 μm.

Moreover, the second distance d2 is smaller than a depth D2 from the bottom surface of the recess 331 to the vibrating arms 121A to 121D in the thickness direction of the upper lid 330. With this configuration, when ultrasonic vibration is applied to the resonator 10, the vibration of the support arm 150 in the Z-axis direction is limited by the limiting portion 335. Therefore, the amplitude of the support arm 150 is reduced as compared with the case where the limiting portion 335 is not provided. Accordingly, the stress applied to the connecting portion between the support arm 150 and the holding portion 140 can be further reduced, and breakage and destruction of the resonator 10 can be further suppressed.

Fourth Exemplary Embodiment

Figure 13:
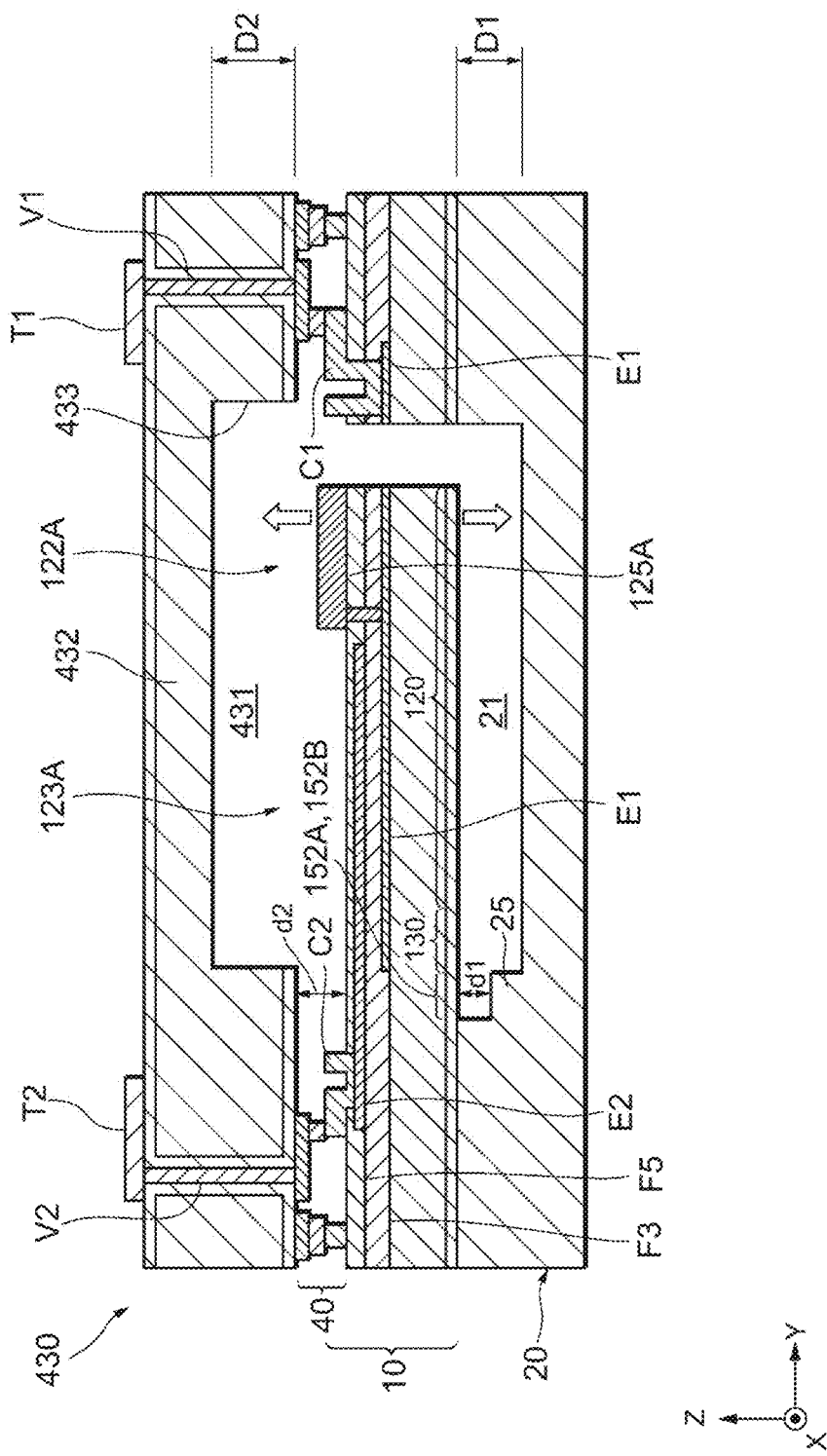
FIG. 13 is a sectional view taken along the Y-axis schematically illustrating the laminated structure of a resonance device according to a fourth exemplary embodiment.

Next, a resonance device according to a fourth exemplary embodiment will be described with reference to FIG. 13. FIG. 13 is a sectional view taken along the Y-axis conceptually illustrating the laminated structure of a resonance device 400 according to the fourth embodiment. FIG. 13 is a sectional view corresponding to FIG. 5 illustrating the first embodiment.

The resonance device 400 of the fourth embodiment is different from the resonance device 1 of the first embodiment in that the size of a recess 431 of an upper lid 430 is smaller.

As illustrated in FIG. 13, the upper lid 430 includes a bottom plate 432 and a side wall 433, similarly to the upper lid 30 of the first embodiment. A recess 431 defined by a surface of the bottom plate 432 and an inner surface of the side wall 433 is formed on the surface of the upper lid 430 facing the resonator 10.

The length of the recess 431 in the Y direction in which the vibrating arms 121A to 121D of the resonator 10 extend is shorter than that of the recess 31 of the first embodiment.

By the bonding portion 40, a lower surface of the upper lid 430 facing the resonator 10 is disposed away from the support arm 150 by the second distance d2 in the thickness direction along the Z-axis direction of the upper lid 430. Therefore, when vibrating in the Z-axis direction, the maximum amplitude of the support arm 150 on the upper lid 430 side is limited to the second distance d2. The second distance d2 is substantially the same as the thickness of the bonding portion 40, and is, for example, approximately 5 μm.

The second distance d2 is smaller than a depth D2 from the bottom surface of the recess 431 to the vibrating arms 121A to 121D in the thickness direction of the upper lid 430. With this configuration, when ultrasonic vibration is applied to the resonator 10, the vibration of the support arm 150 in the Z-axis direction is limited by the lower surface of the upper lid 430 facing the resonator 10, and thus the amplitude of the support arm 150 is reduced. Accordingly, the stress applied to the connecting portion between the support arm 150 and the holding portion 140 can be further reduced, and breakage and destruction of the resonator 10 can be further suppressed.

Fifth Exemplary Embodiment

Figure 14:
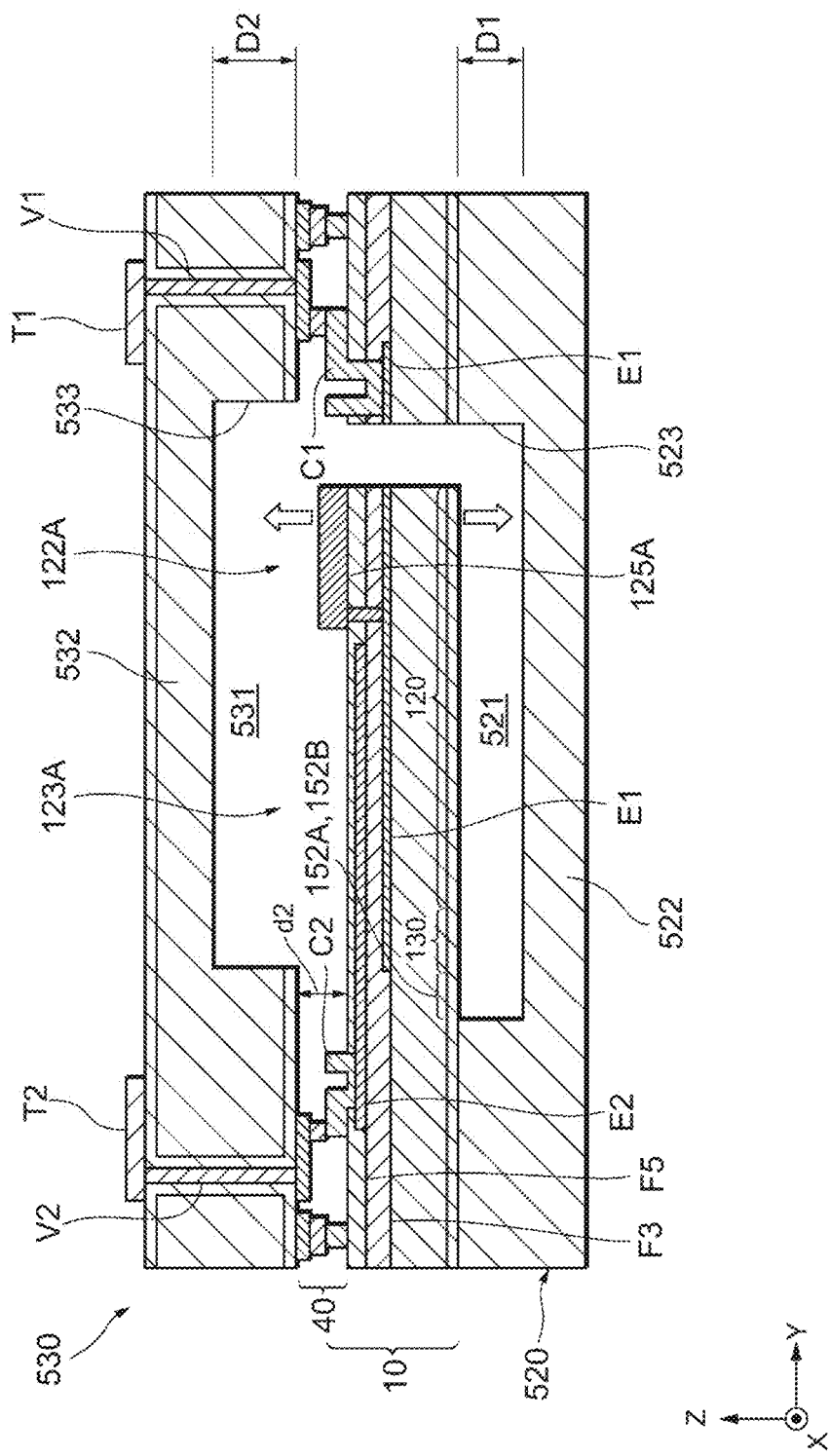
FIG. 14 is a sectional view taken along the Y-axis schematically illustrating the laminated structure of a resonance device according to a fifth exemplary embodiment.

Next, a resonance device according to a fifth exemplary embodiment will be described with reference to FIG. 14. FIG. 14 is a sectional view taken along the Y-axis conceptually illustrating the laminated structure of a resonance device 500 according to the fifth embodiment. FIG. 14 is a sectional view corresponding to FIG. 5 illustrating the first embodiment.

The resonance device 500 according to the fifth embodiment is different from the resonance device 1 of the first embodiment in that the lower lid 520 does not include a limiting portion and the size of a recess 531 of the upper lid 530 is smaller.

As illustrated in FIG. 14, the lower lid 520 includes a bottom plate 522 and a side wall 523, similarly to the lower lid 20 of the first embodiment. A recess 521 defined by a surface of the bottom plate 522 and an inner surface of the side wall 523 is formed on the surface of the lower lid 520 facing the resonator 10.

The limiting portion of the first embodiment is not provided on the surface of the bottom plate 522. Therefore, in the thickness direction of the lower lid 520 along the Z-axis direction, the distance between the bottom surface of the recess 521 and the support arm 150 is the depth D1 of the recess 521.

The upper lid 530 includes a bottom plate 532 and a side wall 533, similarly to the upper lid 30 of the first embodiment. A recess 531 defined by a surface of the bottom plate 532 and an inner surface of the side wall 533 is formed on the surface of the upper lid 530 facing the resonator 10. A length of the recess 531 in the Y direction in which the vibrating arms 121A to 121D of the resonator 10 extend is shorter than that of the recess 31 of the first embodiment.

By the bonding portion 40, a lower surface of the upper lid 530 facing the resonator 10 is disposed away from the support arm 150 by the second distance d2 in the thickness direction along the Z-axis direction of the upper lid 530. Therefore, when vibrating in the Z-axis direction, the maximum amplitude of the support arm 150 on the upper lid 530 side is limited to the second distance d2. The second distance d2 is substantially the same as the thickness of the bonding portion 40, and is, for example, approximately 5 μm.

Moreover, it is noted that the second distance d2 is smaller than the depth D2 from a bottom surface of the recess 531 to the vibrating arms 121A to 121D in the thickness direction of the upper lid 530. With this configuration, when ultrasonic vibration is applied to the resonator 10, the vibration of the support arm 150 in the Z-axis direction is limited by the lower surface of the upper lid 530 facing the resonator 10, and thus the amplitude of the support arm 150 is reduced. Accordingly, the stress applied to the connecting portion between the support arm 150 and the holding portion 140 is also reduced inexpensively and easily, and breakage and destruction of the resonator 10 can be suppressed.

In general, it is noted that the exemplary embodiments of the present invention have been described above. According to the resonance device according to the one embodiment of the present invention, the limiting portion is provided away from the support arm by the first distance in the thickness direction of the lower lid, and the first distance is smaller than the depth from the bottom surface of the recess to the vibrating arm in the thickness direction of the lower lid. With this configuration, when ultrasonic vibration is applied to the resonator, the vibration of the support arm in the Z-axis direction is limited by the limiting portion. Therefore, the amplitude of the support arm is reduced as compared with the case where the limiting portion is not provided. Accordingly, the stress applied to the connecting portion between the support arm and the holding portion can be reduced, and breakage and destruction of the resonator can be suppressed.

In the resonance device described above, the frequency ratio Fs/Fm satisfies the inequality 2.1<Fs/Fm. With this configuration, a large DLD variations can be suppressed.

In the resonance device described above, the connection position between the support side arm and the holding portion is shifted toward the side of the base portion from the center line of the vibrating arm and the base portion in the Y-axis direction in a plan view. With this configuration, the length of the support side arm in the Y-axis direction is shortened, and in the vibration in the main mode, the support rear arm hardly vibrates. Therefore, the amplitude of the support rear arm in the Z-axis direction can be reduced.

In the resonance device described above, the limiting portion is disposed away from at least the support rear arm of the support arm by the first distance in the thickness direction of the lower lid along the Z-axis direction. With this configuration, the stress applied to the connecting portion between the support arm and the holding portion can be reduced, and the volume of the recess can be increased.

In the resonance device described above, the limiting portion is disposed away from at least the support side arm of the support arm by the first distance in the thickness direction of the lower lid along the Z-axis direction. With this configuration, the stress applied to the connecting portion between the support arm and the holding portion is reduced, and the support side arms are connected to the left end portion and the right end portion of the base portion, respectively, and therefore the space of the base portion on the rear end portion side can be reduced, thus the size of the resonance device can be reduced.

In the resonance device described above, the first distance is 1/10 or more of the depth and less than the depth. This makes it possible to easily obtain a resonance device that reduces the stress applied to the connecting portion between the support arm and the holding portion.

In the resonance device described above, the limiting portion includes the step. This configuration provides a resonance device that reduces the stress applied to the connecting portion between the support arm and the holding portion.

In the resonance device described above, the protruding portion is disposed between the vibrating arms adjacent to each other and protrudes from the bottom plate of the recess. With this configuration, the rigidity of the lower lid can be increased, whereby the displacement of the resonator formed on the lower lid and the occurrence of warpage of the lower lid can be suppressed.

In the resonance device described above, the limiting portion is disposed away from the support arm of the resonator by the second distance in the thickness direction of the upper lid along the Z-axis direction, and the second distance is smaller than the depth from the bottom surface of the recess to the vibrating arm in the thickness direction of the upper lid. With this configuration, when ultrasonic vibration is applied to the resonator, the vibration of the support arm in the Z-axis direction is limited by the limiting portion. Therefore, the amplitude of the support arm is reduced as compared with the case where the limiting portion is not provided. Accordingly, the stress applied to the connecting portion between the support arm and the holding portion can be further reduced, and breakage and destruction of the resonator can be further suppressed.

In the resonance device described above, the bonding portion provides the second distance between the lower surface of the upper lid facing the resonator and the support arm in the thickness direction of the upper lid along the Z-axis direction, and the second distance is smaller than the depth from the bottom surface of the recess to the vibrating arm in the thickness direction of the upper lid. With this configuration, when ultrasonic vibration is applied to the resonator, the vibration of the support arm in the Z-axis direction is limited by the lower surface of the upper lid facing the resonator, and thus the amplitude of the support arm is reduced. Accordingly, the stress applied to the connecting portion between the support arm and the holding portion can be further reduced, and breakage and destruction of the resonator can be further suppressed.

In general, it is reiterated that the embodiments described above are intended to facilitate understanding of the present invention, and are not intended to limit the present invention. The present invention can be modified/improved without departing from the spirit thereof, and the present invention includes equivalents thereof. That is, embodiments and/or modifications to which a person skilled in the art has made appropriate design changes are also included in the scope of the present invention as long as they have the features of the present invention. For example, each element included in the embodiments and/or the modifications and the arrangement, material, condition, shape, size, and the like thereof are not limited to those exemplified, and can be appropriately changed. In addition, the embodiments and the modifications are merely examples, and it is needless to say that partial replacement or combination of configurations illustrated in the different embodiments and/or modifications is possible, and these are also included in the scope of the present invention as long as the features of the present invention are included.

REFERENCE SIGNS LIST

1 RESONANCE DEVICE
10 RESONATOR
20 LOWER LID
20' LOWER LID
21 RECESS
22 BOTTOM PLATE
23 SIDE WALL
25, 25A, 25B LIMITING PORTION
30 UPPER LID
31 RECESS
32 BOTTOM PLATE
33 SIDE WALL
40 BONDING PORTION
50 PROTRUDING PORTION
110 VIBRATING PORTION
120 EXCITATION PORTION
121, 121A, 121B, 121C, 121D VIBRATING ARM
122A, 122B, 122C, 122D MASS ADDITION PORTION
123A, 123B, 123C, 123D ARM PORTION
125A, 125B, 125C, 125D MASS ADDITION FILM
130 BASE PORTION
131A FRONT END PORTION
131B REAR END PORTION
131C LEFT END PORTION
131D RIGHT END PORTION
140 HOLDING PORTION
141A, 141B, 141C, 141D FRAME BODY
150 SUPPORT ARM
151A LEFT SUPPORT ARM
151B RIGHT SUPPORT ARM
152A, 152B SUPPORT REAR ARM
153A, 153B SUPPORT SIDE ARM
210 RESONATOR
220 LOWER LID
221 RECESS
221A, 221B, 221C, 221D VIBRATING ARM
222 BOTTOM PLATE
222A, 222B, 222C, 222D MASS ADDITION PORTION
223 SIDE WALL
223A, 223B, 223C, 223D ARM PORTION
225A, 225B, 225C, 225D LIMITING PORTION
230 BASE PORTION
231A FRONT END PORTION
231B REAR END PORTION
231C LEFT END PORTION
231D RIGHT END PORTION

240 HOLDING PORTION
241A, 241B, 241C, 241D FRAME BODY
250 SUPPORT ARM
251A LEFT SUPPORT ARM
251B RIGHT SUPPORT ARM
253A, 253B SUPPORT SIDE ARM
300 RESONANCE DEVICE
330 UPPER LID
331 RECESS
332 BOTTOM PLATE
333 SIDE WALL
335 LIMITING PORTION
400 RESONANCE DEVICE
430 UPPER LID
431 RECESS
432 BOTTOM PLATE
433 SIDE WALL
500 RESONANCE DEVICE
520 LOWER LID
521 RECESS
522 BOTTOM PLATE
523 SIDE WALL
530 UPPER LID
531 RECESS
532 BOTTOM PLATE
533 SIDE WALL
C1, C2, C3 EXTENDED LINE
CL CENTER LINE
D1, D2 DEPTH
d1 FIRST DISTANCE
d2 SECOND DISTANCE
E1, E2 METAL FILM
F2 Si SUBSTRATE
F3 PIEZOELECTRIC FILM
F5 PROTECTIVE FILM
F21 SILICON OXIDE LAYER
Fm FREQUENCY
Fs FREQUENCY
P VIRTUAL PLANE
P10 Si SUBSTRATE
Q10 Si SUBSTRATE
Q11 SILICON OXIDE FILM
r1, r2 CENTRAL AXIS
T1, T2, T3 TERMINAL
V1, V2, V3 THROUGH ELECTRODE
W1, W2 RELEASE WIDTH

What is claimed:

1. A resonance device comprising:
a resonator including:
   a base,
   a vibrating arm extending from a first end of the base in a first direction,
   a frame disposed around at least a part of the vibrating arm and configuring the vibrating arm to vibrate, and
   a support arm connecting the base to the frame; and
a first substrate including:
   a first recess defining at least a part of a vibration space for the resonator, and
   a first limiting portion disposed away from the support arm by a first distance in a thickness direction of the first substrate, with the first distance being smaller than a distance between a bottom surface of the first recess and the vibrating arm in the thickness direction of the first substrate,
   wherein the first limiting portion is disposed at a position so as to overlap at least a portion of the support arm in a plan view.

2. The resonance device according to claim 1, wherein Fs/Fm>2.1, wherein Fm is a frequency of a main vibration mode generated in the vibrating arm and Fs is a frequency of a spurious vibration mode generated in the support arm.

3. The resonance device according to claim 1, wherein a connection position between the support arm and the frame is shifted towards a side of the base from a center of the vibrating arm and the base in the first direction in the plan view.

4. The resonance device according to claim 1, wherein the support arm includes a support side arm extending along the first direction and a support rear arm extending from a second end of the base opposite the first end and extending in a second direction.

5. The resonance device according to claim 4, wherein the first limiting portion is disposed away from at least the support rear arm of the support arm by the first distance in the thickness direction of the first substrate.

6. The resonance device according to claim 1,
   wherein the support arm includes a support side arm extending along the first direction, and
   wherein the first limiting portion is disposed away from at least the support side arm of the support arm by the first distance in the thickness direction of the first substrate.

7. The resonance device according to claim 1, wherein the first distance is 1/10 or more of the distance between the bottom surface of the first recess and the vibrating arm and is less than the distance between the bottom surface of the first recess and the vibrating arm.

8. The resonance device according to claim 1, wherein the first limiting portion comprises a step.

9. The resonance device according to claim 1,
   wherein the resonator includes a plurality of vibrating arms, with each vibrating arm extending from the first end of the base along the first direction, and
   wherein the first substrate further includes a protruding portion that is disposed between two adjacent vibrating arms among the plurality of the vibrating arms and that protrudes from the first recess.

10. The resonance device according to claim 1, further comprising:
   a second substrate disposed to face the first substrate with the resonator interposed therebetween, with the second substrate including a second recess defining at least a part of the vibration space for the resonator.

11. The resonance device according to claim 10, wherein the second substrate includes a second limiting portion disposed away from the support arm by a second distance in a thickness direction of the second substrate.

12. The resonance device according to claim 11, wherein the second distance is smaller than a distance between a bottom surface of the second recess and the vibrating arm in the thickness direction of the second substrate.

13. The resonance device according to claim 11, wherein the second limiting portion comprises a step.

14. The resonance device according to claim 10, further comprising:
   a bonding portion that bonds the resonator and the second substrate, with the bonding portion providing a second distance between a surface of the second substrate facing the resonator and the support arm in a thickness direction of the second substrate,
   wherein the second distance is smaller than a distance between the vibrating arm and a bottom surface of the second recess in the thickness direction of the second substrate.

15. A resonance device comprising:
a resonator including:
   a base,
   a vibrating arm extending from a first end of the base along a first direction,
   a frame disposed around at least a part of the vibrating arm and configuring the vibrating arm to vibrate, and
   a support arm connecting the base to the frame;
a first substrate including a first recess defining at least a part of a vibration space for the resonator;
a second substrate facing the first substrate with the resonator interposed therebetween and including a second recess defining at least a part of the vibration space for the resonator; and
a bonding portion configured to bond the resonator and the second substrate, with the bonding portion providing a predetermined distance between a surface of the second substrate facing the resonator and the support arm in a thickness direction of the second substrate,
wherein the predetermined distance is smaller than a distance between the vibrating arm and a bottom surface of the second recess in the thickness direction of the second substrate
wherein the first substrate includes a first limiting portion disposed away from the support arm by a first distance in a thickness direction of the first substrate, with the first distance being smaller than a distance between a bottom surface of the first recess and the vibrating arm in the thickness direction of the first substrate, and
wherein the first limiting portion is disposed at a position so as to overlap at least a portion of the support arm in a plan view.

16. The resonance device according to claim 15, wherein a connection position between the support arm and the frame is shifted towards a side of the base from a center of the vibrating arm and the base in the first direction in the plan view.

17. The resonance device according to claim 15,
wherein the support arm includes a support side arm extending along the first direction and a support rear arm extending from a second end of the base opposite the first end and extending in a second direction, and
wherein the first limiting portion is disposed away from at least the support rear arm of the support arm by the first distance in the thickness direction of the first substrate.

18. The resonance device according to claim 15,
wherein the support arm includes a support side arm extending along the first direction, and
wherein the first limiting portion is disposed away from at least the support side arm by the first distance in the thickness direction of the first substrate.

19. The resonance device according to claim 15, wherein the first distance is $1/10$ or more of the distance between the bottom surface of the first recess and the vibrating arm and is less than the distance between the bottom surface of the first recess and the vibrating arm.

* * * * *